(12) United States Patent
Hatakeyama et al.

(10) Patent No.: US 7,163,778 B2
(45) Date of Patent: Jan. 16, 2007

(54) ANTI-REFLECTION FILM MATERIAL AND A SUBSTRATE HAVING AN ANTI-REFLECTION FILM AND A METHOD FOR FORMING A PATTERN

(75) Inventors: Jun Hatakeyama, Niigata (JP); Takafumi Ueda, Niigata (JP); Tsutomu Ogihara, Niigata (JP); Motoaki Iwabuchi, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 125 days.

(21) Appl. No.: 10/797,201

(22) Filed: Mar. 11, 2004

(65) Prior Publication Data

US 2004/0191479 A1 Sep. 30, 2004

(30) Foreign Application Priority Data

Mar. 24, 2003 (JP) .............................. 2003-081205
Oct. 29, 2003 (JP) .............................. 2003-369596

(51) Int. Cl.
*G03F 7/11* (2006.01)
*G03F 7/30* (2006.01)
*G03F 7/40* (2006.01)

(52) U.S. Cl. .................. 430/272.1; 430/316; 430/317; 528/34; 528/37; 528/38; 528/40; 528/43

(58) Field of Classification Search ............ 430/272.1, 430/316, 317; 528/34, 37, 38, 40, 43
See application file for complete search history.

(56) References Cited

U.S. PATENT DOCUMENTS

| | | | |
|---|---|---|---|
| 3,741,932 A * | 6/1973 | Smith | 534/726 |
| 6,069,170 A * | 5/2000 | Bringhen et al. | 514/533 |
| 6,730,453 B1 * | 5/2004 | Nakashima et al. | 430/270.1 |

FOREIGN PATENT DOCUMENTS

| | | |
|---|---|---|
| JP | A 56-129261 | 10/1981 |
| JP | A 57-83563 | 5/1982 |
| JP | A 57-131250 | 8/1982 |
| JP | A 5-27444 | 2/1993 |
| JP | A 6-118631 | 4/1994 |
| JP | A 6-118656 | 4/1994 |
| JP | A 6-138664 | 5/1994 |
| JP | B2 7-69611 | 7/1995 |
| JP | A 8-87115 | 4/1996 |
| JP | A 8-179509 | 7/1996 |
| JP | A 10-69072 | 3/1998 |
| JP | A 11-60735 | 3/1999 |
| JP | B2 3118887 | 10/2000 |
| JP | A 2000-356854 | 12/2000 |
| JP | A 2001-53068 | 2/2001 |
| JP | A 2001-92122 | 4/2001 |
| JP | A 2001-343752 | 12/2001 |
| JP | B2 3287119 | 3/2002 |

OTHER PUBLICATIONS

Won D. Kim et al.; "Investigation of Hardmask/BARC Materials for 157nm Lithography"; in Microlighographic Techniques in Integrated Circuit Fabrication II, Chris A. Mack, Xiaocong Yuan, Editors, Proceedings of SPIE; vol. 4226; 2000; pp. 93-106.

Tom Lynch et al.; "Properties and Performance of Near UV Reflectivity Control Layers"; SPIE; vol. 2195; pp. 225-229.

Qinghuang Lin et al.; "A High Resolution 248 nm Bilayer Resist"; Part of SPIE Conference of Advances in Resist Technology and Processing XVI, Santa Clara, California; Mar. 1999; SPIE; vol. 3678; pp. 241-250.

Peter Trefonas et al.; "Organic Antireflective Coatings for 193nm Lithography"; Part of SPIE Conference of Advances in Resist Technology and Processing XVI, Santa Clara, California; Mar. 1999; SPIE; vol. 3678; pp. 702-712.

* cited by examiner

*Primary Examiner*—Richard L. Schilling
(74) *Attorney, Agent, or Firm*—Oliff & Berridge, PLC

(57) ABSTRACT

There is disclosed an anti-reflection film material used in lithography containing at least a polymer compound having repeating units for copolymerization represented by the following general formula (1), or those containing a polymer compound having repeating units for copolymerization represented by the following general formula (2) and a polymer compound having repeating units for copolymerization represented by the following general formula (3). There can be provided an anti-reflection film material which has an excellent reflection preventive effect to exposure at short wavelength, and has high etch selectivity, namely, an etch rate is higher enough than the photoresist film, an etch rate is sufficiently slower than a substrate to be processed, wherein the shape of the resist pattern formed in the photoresist film on the anti-reflection film can be made perpendicular -continued

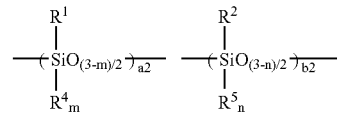 (2)

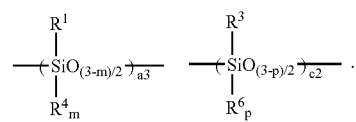 (3)

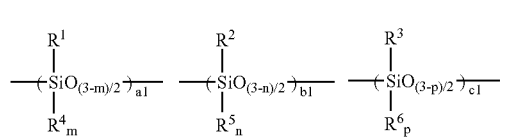 (1)

16 Claims, 3 Drawing Sheets

F I G. 1
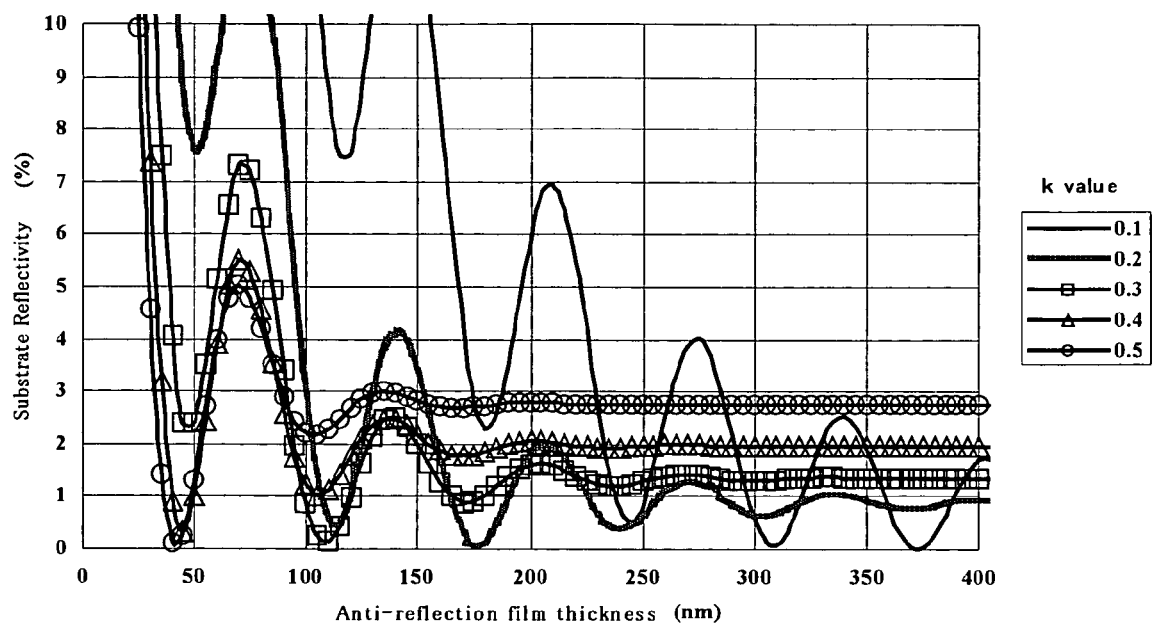

(a)

(b)

(a)

(b)

(c)

(d)

ANTI-REFLECTION FILM MATERIAL AND A SUBSTRATE HAVING AN ANTI-REFLECTION FILM AND A METHOD FOR FORMING A PATTERN

BACKGROUND OF THE INVENTION

1. Field of the Invention

The present invention relates to an anti-reflection film material which is suitably used for fine processing in production processes of a semiconductor device or the like, particularly an anti-reflection film material of which a main component is a polymer compound which contains silicon atoms. Furthermore, the present invention relates to a substrate having an anti-reflection film suitable for exposure with a far ultraviolet ray, ArF excimer laser light (193 nm), $F_2$ laser light (157 nm), $Kr_2$ laser light (146 nm), $Ar_2$ laser light (126 nm), or the like, and a method for forming a pattern on the substrate.

2. Description of the Related Art

With a tendency of high integration and high-speed of LSI, a finer pattern rule is needed in recent years, and in lithography using optical exposure which is used as a general technique at present, an essential resolution derived from a wavelength of a light source has almost reach the limit.

The optical exposure using g line (436 nm) or i line (365 nm) of a mercury-vapor lamp as a light source for lithography when a resist pattern is formed, has been used widely. It has been considered that a method of using an exposure light with a shorter wavelength is effective as a means for a further finer pattern. For this reason, for example, the KrF excimer laser (248 nm) with a short wavelength has come to be used as an exposure light source instead of i line (365 nm), for mass-production process of the 64 M bit DRAM processing method. However, a light source with far shorter wavelength is needed for manufacture of DRAM with a degree-of-integration of 1 G or more which needs a still finer processing technique (for example, a processing dimension is 0.13 μm or less), and lithography using the ArF excimer laser (193 nm) has been especially examined.

In the early stage of lithography using the KrF excimer laser (hereafter referred to as KrF lithography), there has been developed a stepper (aligner) in which an achromatic lens or a reflecting optical system and a broadband light are combined. However, the combination of the narrow spectrum laser light and the refracting-optical-system lens has been dominant, since an accuracy of the achromatic lens or an aspherical surface reflecting optical system is not enough. Generally, it is a phenomenon which has been known well for many years that the incident light and reflected light from a substrate interfere with each other in exposure with a single wavelength, which may lead to generation of a standing wave. Moreover, it is also known that the phenomenon called halation that light is condensed or scattered due to irregularity of a substrate may be caused. Both of the standing waves and the halation may cause variation of a dimension such as line width of a pattern or the like, change in a shape, or the like. Use of a coherent monochromatic light amplifies the standing wave and the halation further as wavelength gets shorter. For this reason, there have been proposed a method of adding a light absorber to a photoresist film material and a method of covering an upper surface of a photoresist film and a surface of a substrate with an anti-reflection film, as a method of suppressing the halation and the standing wave.

However, there was caused a problem that a shape of the resist pattern turns into a taper in the method of adding a light absorber. As a wavelength gets shorter and a pattern gets finer in recent years, the problem of variation of pattern dimension due to the standing wave and the halation has become serious, and it has become impossible to fully solve the problem by the method of adding a light absorber.

In the method of covering the upper surface of the photoresist film with the anti-reflection film, the anti-reflection film (hereafter referred to as the upper layer transmission type anti-reflection film) is effective only in reduction of a standing wave in principle, and it is not effective in the halation. Moreover, it is ideal that the refractive index of the upper layer transmission type anti-reflection film for erasing a standing wave completely is identical with a square root of the refractive index of the photoresist film. Accordingly, when the refractive index is 1.8 which is that of a photoresist film made of poly hydroxy styrenes used in KrF lithography, 1.34 is an ideal value.

When the refractive index is 1.6 which is that of an alicyclic acrylic photoresist film used for the lithography using a ArF excimer laser (hereafter referred to as ArF lithography), the ideal value is 1.27. A perfluoro material is the only material which has such a low refractive index. However, it is necessary that the anti-reflection film is a water-soluble material, since it is more advantageous for the processes that the anti-reflection film can be exfoliated at the time of alkali development. If a hydrophilic substituent is introduced in order to make a highly hydrophobic perfluoro material water-soluble, a refractive index will be increased, and the value in KrF lithography gets around 1.42, and the value in ArF lithography gets around 1.5. Accordingly, when a pattern is formed with a processing dimension of 0.20 μm or less in KrF lithography, it is impossible to suppress the influence of a standing wave only by the combination of a light absorber and the upper layer transmission type anti-reflection film. In ArF lithography, the effectiveness of the upper layer transmission type anti-reflection film can hardly be expected for the reason for the above, and also in KrF lithography, control of a line width becomes severe because of further decrease of the line width in future.

Then, there has become necessary a method of covering a surface of a substrate with an anti-reflection film, i.e., a method of forming an anti-reflection film as a ground of a photoresist film.

In the case that the layer under an anti-reflection film as a ground of the photoresist film is a high reflective substrate, such as poly silicon, aluminum, or the like, the anti-reflection film can reduce reflection from the substrate to 1% or less by being formed of the material having an optimal refractive index (n value) and an optimal extinction coefficient (k value) with a suitable thickness, and thereby quite high effect can be achieved.

FIG. 1 is a graph which shows a relation between a thickness of the anti-reflection film and a reflectivity at a wavelength of 193 nm. FIG. 1 shows that, for example, in the case that the refractive index of the photoresist film is 1.8 at a wavelength of 193 nm, if the refractive index of the anti-reflection film under the photoresist film (a real part of a refractive index) n is 1.5, the extinction coefficient(a imaginary part of a refractive index) k is 0.5, and a thickness is 42 nm, a reflectivity will become 0.5% or less.

However, in the case that there is a level difference in the ground substrate, a thickness of the anti-reflection film is sharply changed at the level difference. Although the reflection preventive effect in the first base with a thickness of 40–45 nm where the interference effect is strong is high, a reflectivity is sharply changed due to variation of a thickness, since the reflection preventive effect of the anti-reflection film uses not only an absorption of light but the interference effect, as shown in FIG. 1.

Then, there has been proposed the material in which a thickness variation on a level difference is suppressed by increasing a molecular weight of a base resin used for the anti-reflection film material, and thereby a conformability is improved (for example, see Japanese Patent Application Laid-open (KOKAI) No. 10-69072). However, if the molecular weight of the base resin becomes high in this case, there may be caused a problem that a pinhole is easily generated after spin coating, a problem that it becomes impossible to be filtered, a problem that viscosity change will be caused with time and a thickness will be varied, and a problem that a crystal is deposited at a tip of a nozzle. Moreover, conformability can be achieved only where a level difference is comparatively low.

Then, there can be considered a method of adopting a thickness more than that of the 3rd base (170 nm or more) where variation of a reflectivity due to variation of a thickness is comparatively small from FIG. 1. In this case, if k value is between 0.2–0.3, and a thickness is 170 nm or more, the variation of a reflectivity due to variation of a thickness will be small, and a reflectivity can be suppressed to 2.0% or less.

Moreover, in the case that the ground of the anti-reflection film is a transparent film, such as an oxide film, a nitride film or the like, and there is a level difference under the transparent film, even though the surface of the transparent film was made flat by CMP (Chemical Mechanical Polishing) or the like, the thickness of the transparent film is varied. In this case, although it is possible to make the thickness of the anti-reflection film on the transparent film constant, the thickness of the film with which the reflectivity is minimum in FIG. 1 will shift by the thickness of the transparent film with a period of $\lambda/2n$ ($\lambda$: exposure wavelength and n: refractive index of the transparent film at the exposure wavelength), when the thickness of the transparent film under the anti-reflection film is varied. If the thickness of the anti-reflection film is 55 nm which provides the minimum reflectivity in the case that the ground is a reflective film, a portion where a reflectivity is high is generated with change of a thickness of the transparent film. In this case, it is necessary to make a thickness of an anti-reflection film thick as 170 nm or more as described above, in order to stabilize the reflectivity to variation of a thickness of a transparent film as a ground.

The material of the anti-reflection film as described above can be roughly classified into an inorganic material and an organic material.

Example of the inorganic material may be a SiON film. Since it is formed by CVD (Chemical Vapor Deposition) with a mixed gas of silane and ammonia or the like and the etch selectivity to the photoresist film is large, it has an advantage that etching load to the photoresist film is small. However, since it is hardly exfoliated, application thereof is limited. Moreover, since it contains a nitrogen atom and is basic, there is also a disadvantage that the footing profile is likely caused in the case of a positive resist, and an undercut profile is easily caused in the case of a negative resist.

The organic material is advantageous, since it can be formed by a spin coating, it does not need special equipments, such as CVD system, sputtering system or the like, it can be stripped together with the photoresist film, footing profile or the like is not generated, the shape is simple, and it has an excellent adhesion property with the photoresist film. Accordingly, a lot of anti-reflection film materials based on organic materials were proposed. For example, there were proposed a condensation product of a diphenylamine derivative and a formaldehyde modified melamine resin, those consisting of an alkali soluble resin and a light absorber (for example, see Japanese Patent publication No.7-69611), those containing a reaction product of a maleic anhydride copolymer and diamine type light absorber (for example, see U.S. Pat. No. 5,294,680 specification), those containing a resin binder and a methylol melamic heat crosslinking agent (for example, see Japanese Patent Application Laid-open (KOKAI) No. 6-118631), the acrylate resin base type which has a carboxylic acid group, an epoxy group, and a light-absorption group in the same molecule (for example, see Japanese Patent Application Laid-open (KOKAI) No. 6-118656), those consisting of methylol melamine and a benzophenone light absorber (for example, see Japanese Patent Application Laid-open (KOKAI) No. 8-87115), those in which a low molecule light absorber is added to a polyvinyl alcohol resin (for example, see Japanese Patent Application Laid-open (KOKAI) No. 8-179509). All of the anti-reflection film material using these organic materials as a base is produced by a method of adding a light absorber into a binder polymer, or introducing a light-absorption group into a polymer as a substituent. However, since many of the light absorbers have an aromatic group or a double bond, dry etch resistance is raised by addition of the light absorber, and there is a disadvantages that a dry etch selectivity to the photoresist film is not so high. Since a pattern tends to be finer, a photoresist film tends to be thin, and furthermore, an acrylic or an alicyclic polymer will be used as a photoresist film material in ArF lithography of the next generation, etching resistance of the photoresist film tends to be lowered. Furthermore, there is also a problem that a thickness of the anti-reflection film needs to be increased, as explained above. For these reasons, etching is becoming a serious problem, and thus the anti-reflection film with high etch selectivity to the photoresist film, namely the anti-reflection film of which an etch rate is high when the anti-reflection film is etched using the photoresist film as a mask, has been desired.

Furthermore, the light absorber for affording the optimal absorbancy index in an anti-reflection film has been examined. Especially, there has been proposed an anthracene type in KrF lithography, and a phenyl type in ArF lithography. However, as explained above, they are also the substituents which have an excellent dry etching resistance. Accordingly, even if a polymer having low etching resistance such as an acrylic resin is used as a polymer backbone from which a die is suspended, there is a practical limit.

Furthermore, the photoresist film tends to be thinner with progress of tendency of high resolution in recent years. Although the improvement in etching resistance of the photoresist film is needed as a film gets thin, it is not enough at present. Then, a hard mask method is used as a pattern transfer method of a thin photoresist film.

As a hard mask, a $SiO_2$ film has been examined when a substrate to be processed is poly silicon (p-Si), and SiN, W—Si, amorphous Si, or the like have been examined when a substrate to be processed has a $SiO_2$ film. Furthermore, a hard mask made of a SiON film which also has a function as an anti-reflection film has been proposed (for example, see SPIE2000 Vol.4226 p93). In a hard mask method, there are a case where a hard mask remains and a case where a hard mask is stripped. In the case that a ground is an insulator film such as a $SiO_2$ film, it needs to be stripped, since especially, W—Si and an amorphous Si film are good conductive film. When a hard mask is a SiN film, it is not necessary to be stripped in some cases, since it is an insulator layer. However, since it has a similar composition of elements to $SiO_2$, there is a disadvantage that the etch selectivity which is an original function as a hard mask is low.

SUMMARY OF THE INVENTION

The present invention has been made in order to solve such problems. The object of the present invention is to provide an anti-reflection film material which has an excellent reflection preventive effect to exposure at short wavelength, and has high etch selectivity, namely, an etch rate is higher enough than the photoresist film, an etch rate is sufficiently slower than a substrate to be processed, wherein the shape of the resist pattern formed in the photoresist film on the anti-reflection film can be made perpendicular, and to provide a method of forming a pattern on a substrate using the anti-reflection film material.

To achieve the above mentioned object, the present invention provides an anti-reflection film material used in lithography which contains at least a polymer compound having repeating units for copolymerization represented by the following general formula (1).

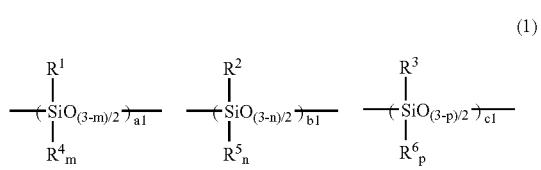

(1)

(In the formula, $R^1$ is a monovalent organic group having a crosslink group, $R^2$ is a monovalent organic group having a light-absorption group, and $R^3$ is a monovalent organic group which has at least one functional group selected from the group consisting of carbonyl, ester, lactone, amide, ether, and nitrile. a1, b1, and c1 are $0<a1<1$, $0<b1<1$, $0<c1<1$, and $0.5 \leq a1+b1+c1 \leq 1$. Each of $R^4$, $R^5$ and $R^6$ is a hydrogen atom, a hydroxy group, an alkyl group having 1–6 carbon atoms, an aryl group having 6–10 carbon atoms, or a fluorinated alkyl group having 1–6 carbon atoms. Each of m, n and p is 0 or 1.)

Moreover, the present invention provides an anti-reflection film material used in lithography which contains at least a polymer compound having repeating units for copolymerization represented by the following general formula (2) and a polymer compound having repeating units for copolymerization represented by the following general formula (3).

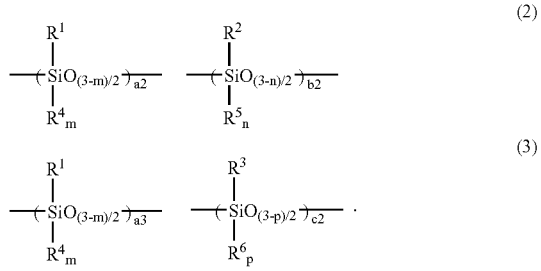

(In the formula, $R^1$, $R^2$, $R^3$, $R^4$, $R^5$, $R^6$, m, n, and p are as defined above. a2 and b2 are $0<a2<1$, $0<b2<1$ and $0.5 \leq a2+b2<1$. a3 and c2 are $0<a3<1$, $0<c2<1$, and $0.5 \leq a3+c2 \leq 1$.)

In addition, a blend ratio of the polymer compound which has repeating units for copolymerization represented by the general formula (2) and the polymer compound which has repeating units for copolymerization represented by the general formula (3) is as follows: when the weight of the polymer compound which has repeating units for copolymerization represented by the general formula (3) is 1, the polymer compound which has repeating units for copolymerization represented by the general formula (2) is blended preferably in the range of 0.1 to 10, more preferably in the range of 0.2 to 5.

The anti-reflection film using these anti-reflection film materials has the outstanding reflection preventive effect that halation and a standing wave can fully be suppressed at the time of exposure, especially in the lithography by which a short wavelength light is used. Moreover, since the acid diffusion to the photoresist film from the above-mentioned anti-reflection film can be prevented at the time of exposure, a resist pattern is made in a perpendicular configuration. Furthermore, etch selectivity is high, etch rate is higher than the photoresist film at the time of etching of the anti-reflection film, and an etch rate is slower than a substrate at the time of etching of the substrate. Therefore, a fine pattern can be formed on a substrate with high degree of accuracy by lithography.

Moreover, it is desirable that the anti-reflection film material of the present invention further contains an organic solvent and/or an acid generating agent.

As described above, if the above-mentioned anti-reflection film material of the present invention further contains the organic solvent and/or the acid generating agent, the crosslinking reaction in a anti-reflection film can be promoted by baking after application to a substrate or the like. Therefore, in such an anti-reflection film, there is little possibility of mixing with the photoresist film, and diffusion of the acid to the photoresist film.

Furthermore, it is desirable that the anti-reflection film material of the present invention further contains a crosslinking agent.

As described above, if the above-mentioned anti-reflection film material of the present invention further contains a crosslinking agent, a crosslinking reaction in the anti-reflection film can be further promoted by baking after application to the substrate or the like.

Moreover, the anti-reflection film material of the present invention may be those wherein the above-mentioned light-absorption group in the repeating unit of the polymer compound contained in the anti-reflection film material is an aromatic group or a group having a Si—Si bond.

As described above, if the above-mentioned light-absorption group in the repeating units which the polymer compound contained in the anti-reflection film material is an aromatic group or a group having a Si—Si bond, the anti-reflection film which uses the anti-reflection film material can have an outstanding reflection preventive effect, and can fully suppress halation and a standing wave.

Moreover, the present invention provides a substrate which has at least an anti-reflection film obtained by baking the anti-reflection film material of the present invention on the substrate.

As described above, if the substrate which has at least the anti-reflection film obtained by baking the anti-reflection film material of the present invention on the substrate is used, a fine pattern can be formed by lithography at high accuracy.

Moreover, the present invention provides a method for forming a pattern on a substrate by lithography comprising at least applying to the substrate an anti-reflection film material of the present invention and baking the anti-reflection film material to form an anti-reflection film, applying to the anti-reflection film a photoresist film material and pre-baking the photoresist film material to form a photoresist film, exposing a pattern circuit range of the photoresist film, developing with a developer to form a resist pattern on the photoresist film, and etching the anti-reflection film and the substrate with using as a mask the photoresist film on which the resist pattern is formed to form a pattern on the substrate.

As described above, if a pattern is formed on the substrate by lithography using the anti-reflection film material of the present invention, a fine pattern can be formed on the substrate with high accuracy.

Moreover, the present invention provides a method for forming a pattern on a substrate by lithography comprising at least applying to the substrate an anti-reflection film material of the present invention and baking the anti-reflection film material to form an anti-reflection film, applying to the anti-reflection film a photoresist film material and pre-baking the photoresist film material to form a photoresist film, exposing a pattern circuit range of the photoresist film, developing with a developer to form a resist pattern on the photoresist film, etching the anti-reflection film with using as a mask the photoresist film on which the resist pattern is formed, and etching the substrate with using as a mask the anti-reflection film on which the pattern is formed to form a pattern on the substrate.

As described above, a pattern can be formed on a substrate using the anti-reflection film material of the present invention as a mask, and a fine pattern can be formed on a substrate with high accuracy.

Moreover, the present invention provides a method of forming a pattern on a substrate with lithography, comprising at least, forming an organic film on the substrate, applying to the organic film the anti-reflection film material of the present invention and baking the anti-reflection film material to form an anti-reflection film, applying a photoresist film material to the anti-reflection film and pre-baking the photoresist film material to form a photoresist film, exposing a pattern circuit range of the photoresist film, developing with a developer to form a resist pattern on the photoresist film, etching the anti-reflection film using as a mask the photoresist film on which the resist pattern is formed, etching the organic film using as a mask the anti-reflection film on which the pattern is formed, and etching the substrate to form a pattern on the substrate.

As described above, the anti-reflection film material of the present invention may be applied to the organic film on the substrate, a fine pattern can be formed on the substrate with high accuracy by forming a pattern on the substrate by lithography using the anti-reflection film material.

As explained above, if the anti-reflection film material of the present invention is used, there can be obtained a anti-reflection film having the n value and k value which can demonstrate a sufficient reflection preventive effect, especially to exposure by short wavelength, wherein etch selectivity is high, i.e., an etching rate is higher enough than the photoresist film, and slower enough than a substrate to be processed. Therefore, in the anti-reflection film, the effect as a hard mask to a substrate to be processed is also high. Furthermore, the shape of the resist pattern formed on the photoresist film on this anti-reflection film can be made perpendicular without being a reverse taper, footing profile, or the like.

BRIEF DESCRIPTION OF THE DRAWINGS

FIG. 1 is a graph which shows the relation between a thickness of an anti-reflection film and reflectivity.

DESCRIPTION OF THE INVENTION AND EMBODIMENT

Figure 2:
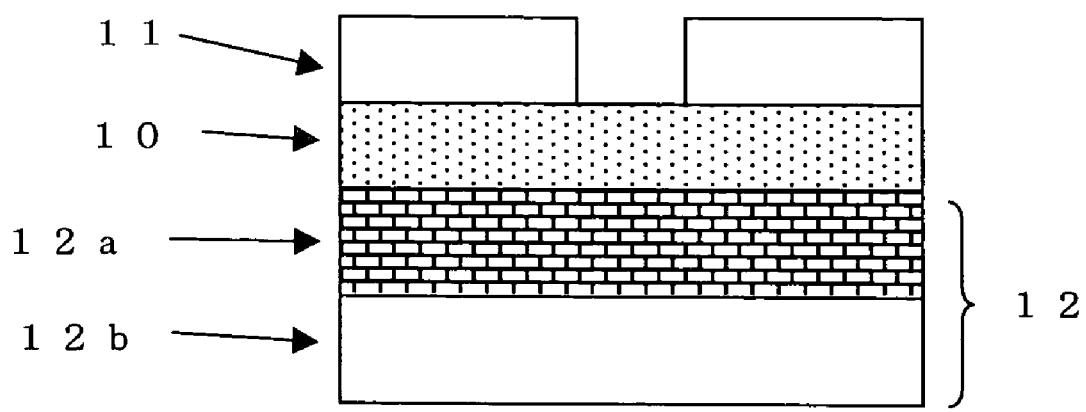
FIG. 2 is an explanatory view of a method for forming a pattern of the present invention.
(a) the resist pattern after development, and
(b) the pattern after a substrate dry etching.
Figure 2:
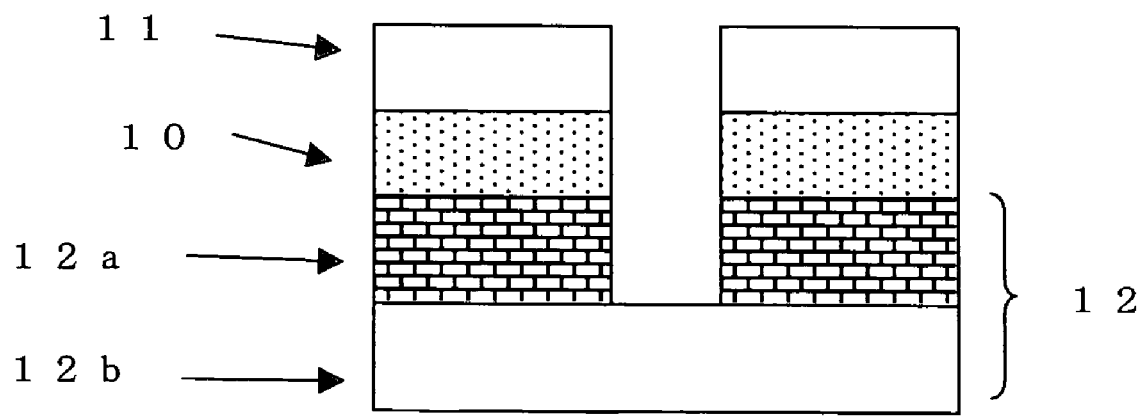

Hereafter, the present invention will be explained.

As to one of the performances required for an anti-reflection film, high etching selectivity to the photoresist film, namely a higher etching rate than a photoresist film. It is known that, generally, the anti-reflection film using the material which contains silicon has a high etching rate under the etching conditions by which a fluorocarbon gas is used, and has a high etch selectivity to the photoresist film. It is considered that etch selectivity can be significantly raised by using the anti-reflection film containing silicon atoms. For example, there has been proposed an anti-reflection film for KrF lithography having a poly silane skeleton in which a phenyl group is suspended (for example, see Japanese Patent Application Laid-open (KOKAI) No.11-60735), and high etching selectivity is achieved thereby.

Furthermore, a silica coating liquid for formation of an insulator film has been proposed (for example, see Japanese Patent Application Laid-open (KOKAI) No.57-83563, Japanese Patent Application Laid-open (KOKAI) No.57-131250, Japanese Patent Application Laid-open (KOKAI) No.56-129261 and a Japanese Patent Publication No.3287119). There have been proposed a lot of methods for formation of a pattern which use a silicon containing polymer as a lower layer film in a multilayer-resist process using this technique. For example, there has been proposed a three-layer process in which an organic film is formed on a substrate, spin-coating of a silica glass is carried out thereon, and a resist pattern on the silica-glass layer is transferred to the silica-glass layer, a pattern is transferred to the organic film layer by oxygen gas etching, and finally a substrate is processed (for example, see Japanese patent No. 3118887 specification and Japanese Patent Application Laid-open (KOKAI) No.2000-356854). A silsesquioxane polymer material for a silica-glass layer which also has the effect as an anti-reflection film have been proposed (for example, see Japanese Patent Application Laid-open (KOKAI) No.5-27444, Japanese Patent Application Laid-open (KOKAI) No.6-138664, Japanese Patent Application Laid-open (KOKAI) No.2001-53068, Japanese Patent Application Laid-open (KOKAI) No. 2001-92122, and Japanese Patent Application Laid-open (KOKAI) No. 2001-343752). Furthermore, there has been proposed a composition containing as a base a silsesquioxane polymer which has both of a function as an anti-reflection film and a function as hard surface mask blank (for example, see U.S. Pat. No. 6,420,088 specification).

Furthermore, one of other performances required for an anti-reflection film is that there is no inter-mixing with a photoresist film and that there is no diffusion of a low molecule component to a photoresist film layer (Proc. SPIE Vol.2195, 225–229 (1994)). In order to prevent them, the method of baking for thermal crosslinking after spin-coating of an anti-reflection film material to a substrate or the like is generally adopted.

On the other hand, it is desirable that the resist pattern on the anti-reflection film has a perpendicular configuration without footing profile or an undercut. This is because a dimension conversion difference may arise after etching of the anti-reflection film when there is an footing profile, or the resist pattern may collapse after development when there is a undercut configuration (it is also called a reverse taper configuration).

It has been reported that crosslinking with an acid is effective in reduction of footing profile in a positive resist (Proc. SPIE Vol.3678, 241–250 (1999)). A method of adding a crosslinking agent and crosslinking with an acid are important in an anti-reflection film material, and addition of a crosslinking agent is effective for reduction of footing profile (for example, see the U.S. Pat. No. 6,420,088 specification and Japanese Patent Application Laid-open (KOKAI) No. 2001-53068).

The cause of the problem that the cross-section of a pattern formed on the photoresist film after development becomes a reverse taper configuration is considered to be that the acid used for the crosslinking reaction of the anti-reflection film migrates to the photoresist film layer, allowing the acid unstable group of the photoresist film to leave at the time of baking, or neutralizing an amine compound added in the photoresist film. Although there is a method of making the acid generated in a anti-reflection film bulky in order to prevent an acid from migrating to the photoresist film layer, it makes a crosslinking reaction to hardly progress, and cause the inter-mixing with the photoresist film, and thus it is not desirable.

Here, the material using a terpolymer of hydroxy ethyl methacrylate, methyl acrylate and styrene has been proposed as an organic anti-reflection film for ArF lithography (SPIE Vol.3678 p702 (1999)). As a crosslinking system, hydroxy ethyl methacrylate and a glycol uryl crosslinking agent are used. Here, existence of methyl acrylate should be noted. The resist pattern on this anti-reflection film can be prevented from becoming a reverse taper configuration by copolymerizing it. It is considered that methyl acrylate improves adhesion with a resist, and also is effective in suppressing acid diffusion.

As a result of repeating examination and research, the inventors has concluded that in order to prevent the resist pattern on the anti-reflection film from becoming a reverse taper configuration, it is necessary to keep the acid in the anti-reflection film after crosslinking, and it was effective for it to use a polymer with at least one functional group selected from the group consisting of a carbonyl group, an ester group, a lactone group, an amide group, an ether group and a nitrile group. Therefore, the inventors have found that if a siloxane polymer from which the above-mentioned functional groups are suspended is used as a base of the anti-reflection film material, the anti-reflection film formed with the anti-reflection film material functions as an anti-reflection film excellent in exposure with a short wavelength light, and etch selectivity thereof can be significantly raised, and the configuration of the resist pattern on the anti-reflection film can be perpendicular, and thereby completed the present invention.

Hereafter, embodiments of the present invention will be explained. However, the present invention is not limited thereto.

The present invention provides an anti-reflection film material used in lithography which contains at least a polymer compound having repeating units for copolymerization represented by the following general formula (1).

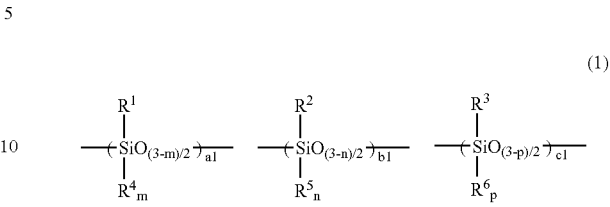

(1)

(In the formula, $R^1$ is a monovalent organic group having a crosslink group, $R^2$ is a monovalent organic group having a light-absorption group, and $R^3$ is a monovalent organic group which has at least one functional group selected from the group consisting of carbonyl, ester, lactone, amide, ether, and nitrile. a1, b1 and C1 are $0<a1<1$, $0<b1<1$, $0<c1<1$, and $0.5 \leq a1+b1+c1 \leq 1$. Each of $R^4$, $R^5$ and $R^6$ is a hydrogen atom, a hydroxy group, an alkyl group having 1–6 carbon atoms, an aryl group having 6–10 carbon atoms, or a fluorinated alkyl group having 1–6 carbon atoms. Each of m, n and p is 0 or 1.)

Moreover, the present invention provides an anti-reflection film material used in lithography which contains at least a polymer compound having repeating units for copolymerization represented by the following general formula (2) and a polymer compound having repeating units for copolymerization represented by the following general formula (3).

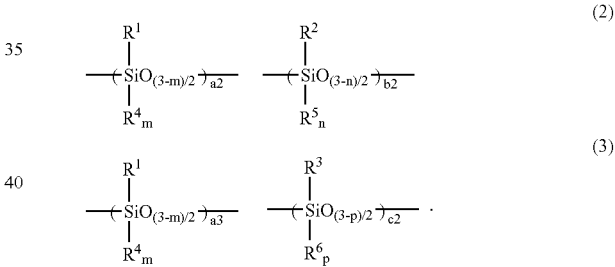

(2)

(3)

(In the formula, $R^1$, $R^2$, $R^3$, $R^4$, $R^5$, $R^6$, m, n, and p are as defined above. a2 and b2 are $0<a2<1$, $0<b2<1$, and $0.5 \leq a2+b2 \leq 1$. a3 and c2 are $0<a3<1$, $0<c2<1$, and $0.5 \leq a3+c2 \leq 1$.)

In addition, a blend ratio of the polymer compound which has repeating units for copolymerization represented by the general formula (2) and the polymer compound which has repeating units for copolymerization represented by the general formula (3) is as follows: when the weight of the polymer compound which has repeating units for copolymerization represented by the general formula (3) is 1, the polymer compound which has repeating units for copolymerization represented by the general formula (2) is blended preferably in the range of 0.1 to 10, more preferably in the range of 0.2 to 5.

The anti-reflection film using these anti-reflection film materials has the outstanding reflection preventive effect that halation and a standing wave can fully be suppressed at the time of exposure, especially in the lithography by which a short wavelength light is used. Moreover, since the acid diffusion to the photoresist film from the above-mentioned anti-reflection film can be prevented at the time of exposure, a resist pattern is made in a perpendicular configuration.

Furthermore, etch selectivity is high, etch rate of the anti-reflection film is higher than that of the photoresist film at the time of etching of the anti-reflection film, and etch rate of the anti-reflection film is lower than that of a substrate at the time of etching of a substrate. Therefore, a fine pattern can be formed on a substrate with high degree of accuracy by lithography.

Examples of the monovalent organic groups having a crosslink group shown as $R^1$ in repeating units a1, a2, and a3 in general formulae (1), (2), and (3) are listed below. In the following formulae, each of the organic groups is shown in the state that it is suspended from the polymer.

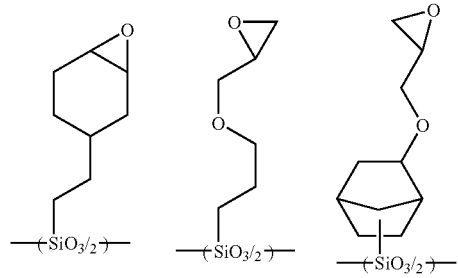
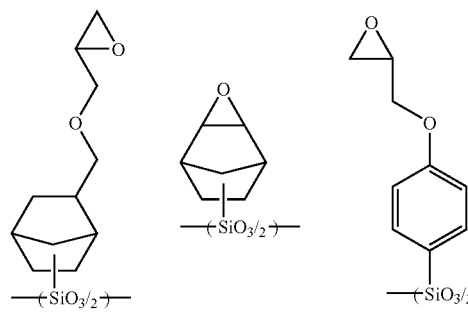
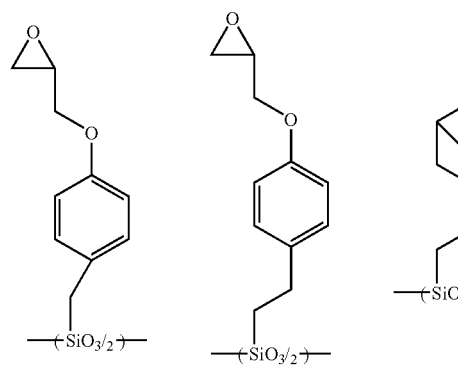
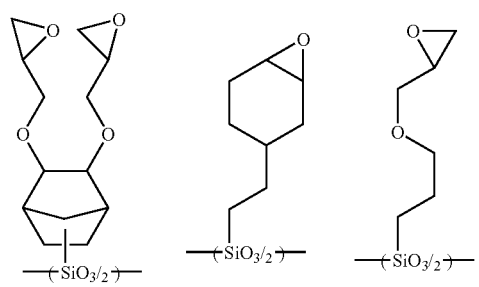

-continued

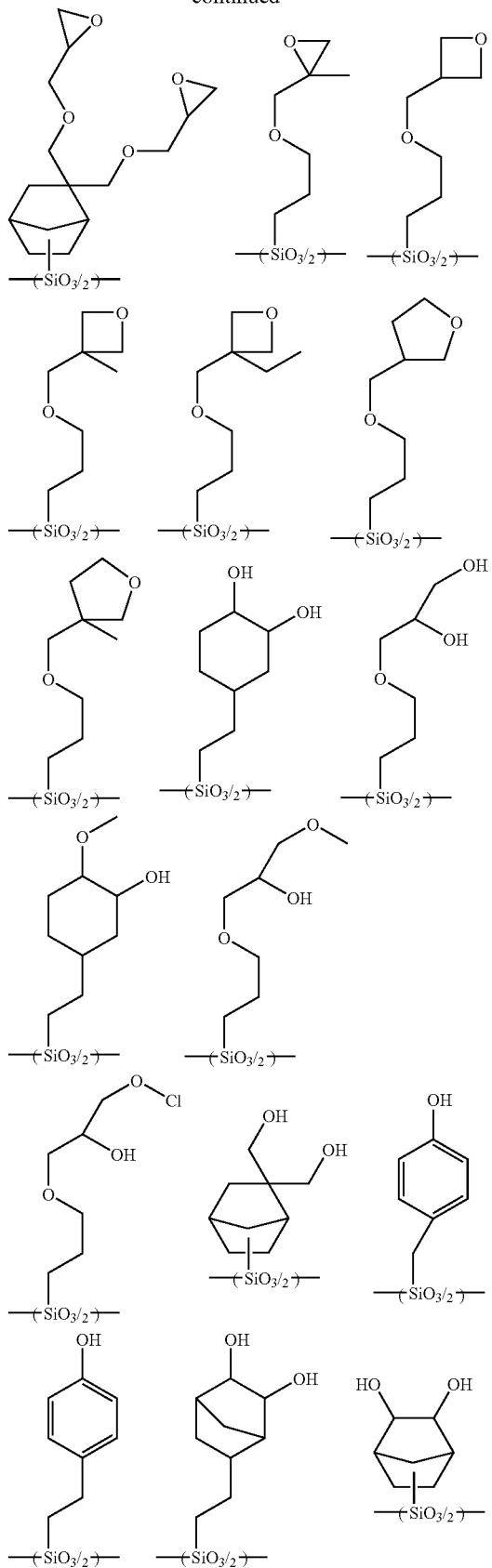

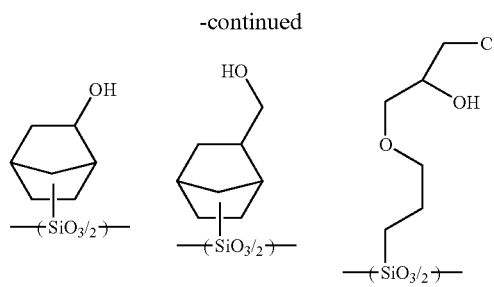

Next, examples of a monovalent organic group which has the light-absorption group shown as R² in the repeating units b1 and b2 in the general formulae (1) and (2) are listed below. In the following formulae, each of the organic group is shown in the state that it is suspended from the polymer.

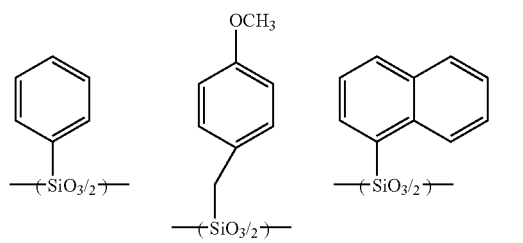

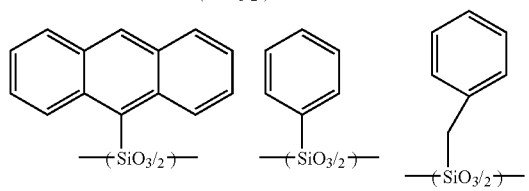

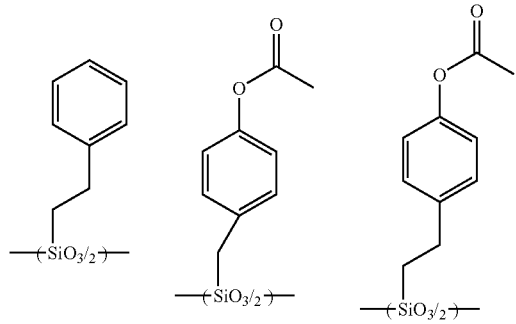

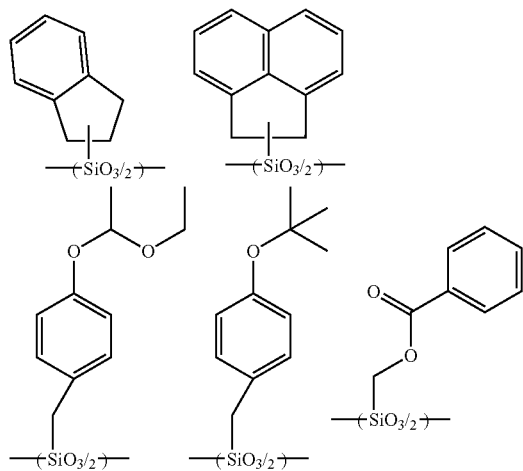

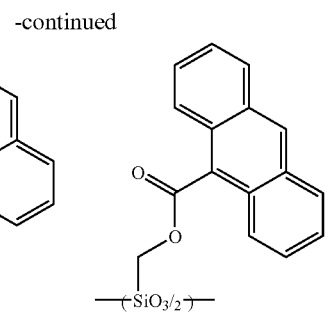

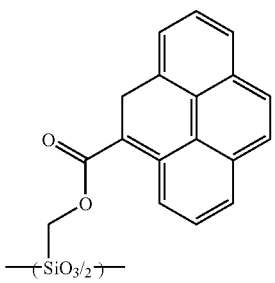

A methoxy group, an acetoxy group and an acetal group in the monovalent organic group having a light-absorption group which are listed above can also be deprotected to be a hydroxy group during or after polymerization.

In addition to those having the above-mentioned aromatic light-absorption group, those having a light-absorption group which has a Si—Si bond can also be used. Specific examples will be listed below. In the following formulae, each of the organic groups is shown in the state that it is suspended from the polymer.

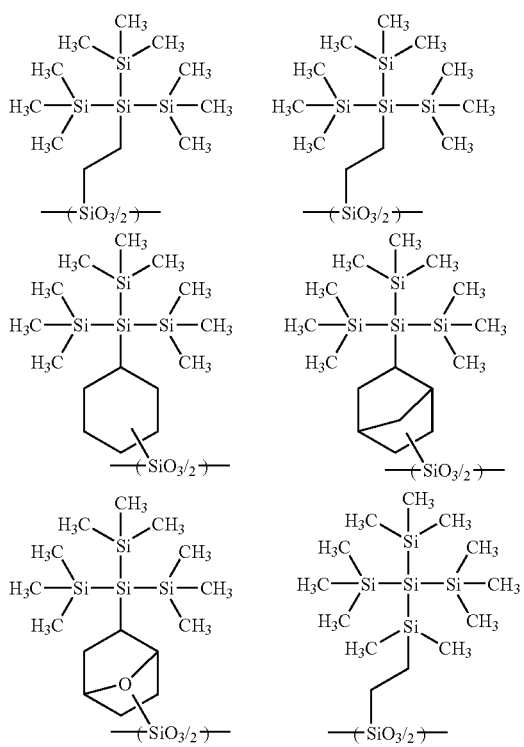

-continued

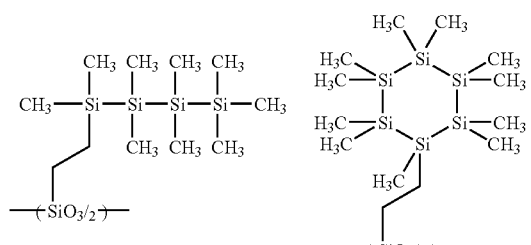
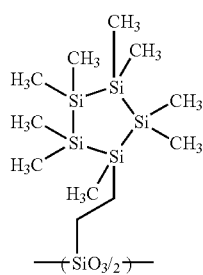

Next, examples of a monovalent organic group represented as $R^3$ in the repeating units c1 and c2 in the general formulae (1) and (3) having at least one functional group selected from a group consisting of carbonyl, ester, lactone, amide, ether and nitrile are listed below. In the following formulae, each of the organic groups is shown in the state that it is suspended from the polymer.

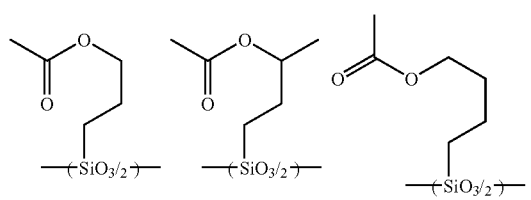
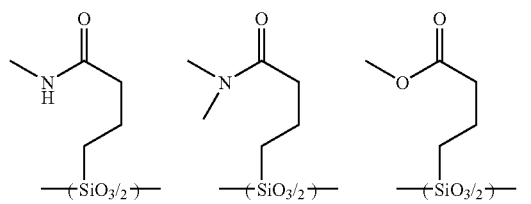
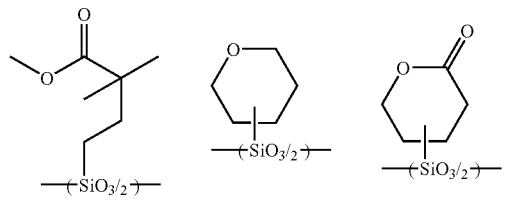
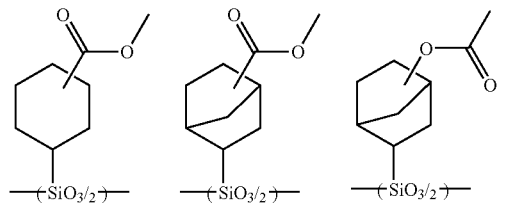

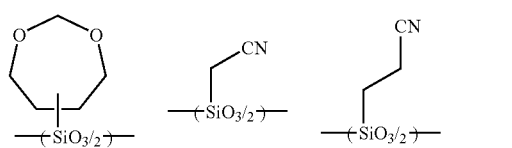
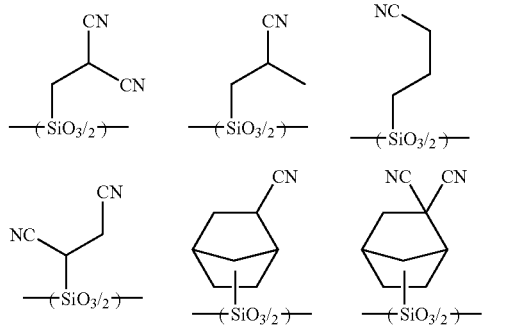
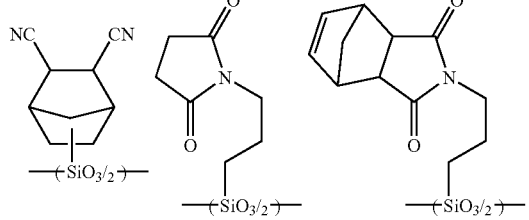
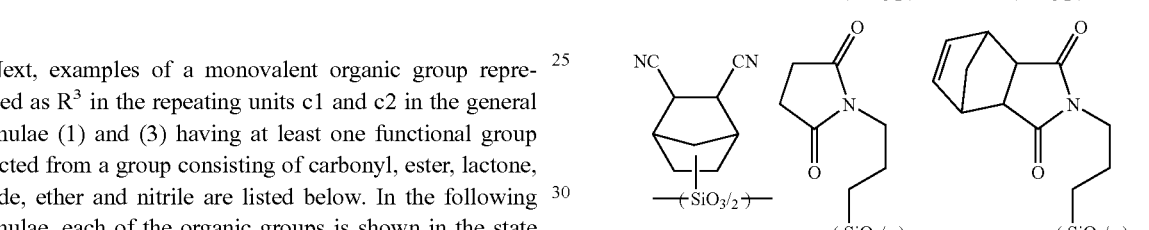
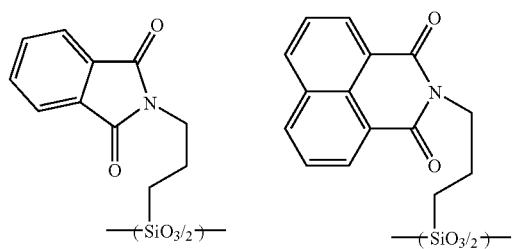
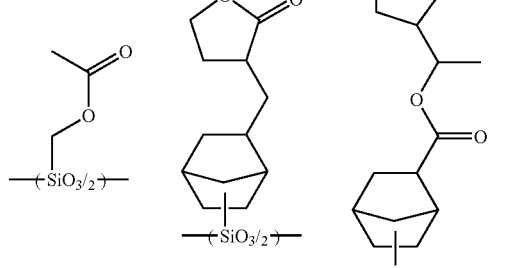
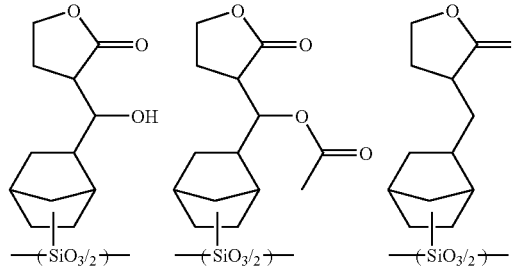

-continued

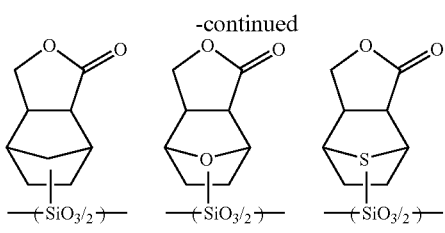

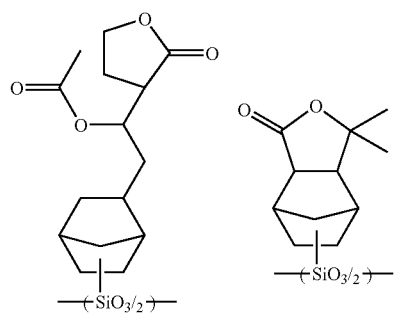

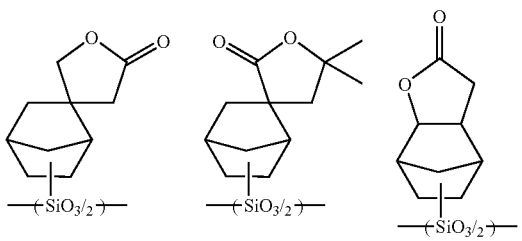

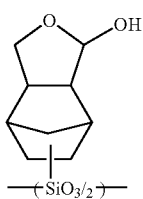

Moreover, specific examples of a hydrogen atom, a hydroxy group, an alkyl group having 1–6 carbon atoms, an aryl group having 6–10 carbon atoms, a fluorinated alkyl group having 1–6 carbon atoms, represented by $R^4$, $R^5$, and $R^6$ in the general formulae (1), (2), and (3) may include a hydrogen atom, hydroxy group, methyl group, ethyl group, n-propyl group, cyclohexyl group, trifluoro propyl group, phenyl group, naphthyl group and the like.

A molecular weight (Mw) of each of the polymer compounds including the repeating units represented by the general formulae (1), (2), and (3) is preferably in the range of 1,000–1,000,000, and more preferably in the range of 1,500–500,000.

In order to obtain the polymer compound which is used for the anti-reflection film material of the present invention and which has repeating units for copolymerization shown by the general formulae (1), (2), and (3), the silicon containing compounds shown by the following general formulae may be used.

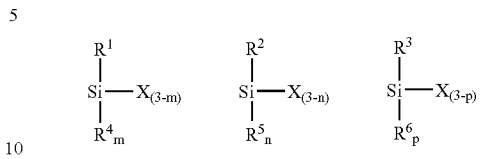

モノマーa     モノマーb     モノマーc (In the formula, $R^1$, $R^2$, $R^3$, $R^4$, $R^5$ and $R^6$ represent the same as above. X represents the same or different substituents selected from the group consisting of a halogen atom, a hydroxy group, and an alkoxy group having 1–4 carbon atoms. In the case that m, n and p are 0, the polymer after polymerization is silsesquioxane, which is the polymer with a silicone ladder configuration. In the case that m, n and p are 1, it is a straight chain silicone polymer.)

The polymer compound used for the anti-reflection film material of the present invention is synthesized by carrying out a copolycondensation of the above monomers a-c by hydrolysis. An amount of water added in the hydrolysis reaction is desirably 0.2–10 mol per one mol of the monomer. A catalyst can also be used at this time. Examples of the catalyst may include acids, such as acetic acid, propionic acid, oleic acid, stearic acid, linolic acid, salicylic acid, benzoic acid, formic acid, malonic acid, phthalic acid, fumaric acid, citric acid, tartaric acid, hydrochloric acid, sulfuric acid, nitric acid, sulfonic acid, methyl sulfonic acid, toluenesulfonic acid, trifluoromethane sulfonic acid and the like; bases such as ammonia, sodium hydroxide, potassium hydroxide, barium hydroxide, calcium hydroxide, trimethylamine, triethylamine, triethanolamine, tetra methyl ammonium hydroxide, choline hydroxide, tetra butyl ammonium hydroxide and the like; metal chelate compounds such as tetraalkoxy titanium, trialkoxy mono(acetyl acetonato) titanium, tetra alkoxy zirconium, trialkoxy mono(acetyl acetonato)zirconium and the like. In order to avoid open of epoxy ring and in order to avoid contamination by impurities of an alkali, metal or the like during polymerization, organic amines are used preferably.

The reaction is conducted by dissolving monomers in an organic solvent, and then adding water thereto to initiate a hydrolysis reaction. A catalyst may be added either in water or in an organic solvent. A reaction temperature is 0–100° C., preferably 10–80° C. The preferable method comprises heating at 10–50° C. at the time of dropping of water, and then raising a temperature to 40–80° C. for maturing. An organic solvent is preferably those which is hardly dissolved or not dissolved in water. Preferable examples thereof may include: tetrahydrofuran, toluene, hexane, ethyl acetate, cyclohexanone, methyl-2-n-amyl ketone, propyleneglycol monomethyl ether, ethylene glycol monomethyl ether, propylene glycol monoethyl ether, ethylene glycol monoethyl ether, propylene-glycol dimethyl ether, a diethylene glycol dimethyl ether, propyleneglycol monomethyl ether acetate, propyleneglycol monoethyl ether acetate, ethyl pyruvate, butyl acetate, methyl 3-methoxy propionate, ethyl 3-ethoxy propionate, tert-butyl acetate, tert-butyl propionate, propylene-glycol mono tert-butyl-ether acetate, γ-butyl lactone, and the like.

Then, a catalyst is neutralized, and an organic-solvent layer is separated and is dehydrated. Since the remained moisture may advance a condensation reaction of silanol, it is necessary to fully perform dehydration. Examples of preferable methods include an adsorption method with salts such as magnesium sulfate or molecular sieves, and an azeotropy dehydration method with removing a solvent.

The catalyst which contains an epoxy group as a crosslink group can be converted to alcohols by open-ring reaction at the time of a condensation reaction with the acid catalyst.

Moreover, it is preferable that the anti-reflection film material of the present invention further contains an organic solvent and/or an acid generating agent.

As described above, if the anti-reflection film material of the present invention further contains an organic solvent and/or an acid generating agent, a crosslinking reaction in the anti-reflection film can be promoted by baking after application to a substrate or the like. Therefore, such an anti-reflection film has less possibility to be mixed with the photoresist film, and thereby diffusion of acids to the photoresist film will become few.

An organic solvent used for the anti-reflection film material of the present invention can be any organic solvent in which a base resin, an acid generating agent, other additives and the like can be dissolved. Examples of such an organic solvent may include: ketone such as cyclohexanone and methyl-2-n-amyl ketone; alcohols such as 3-methoxy butanol, 3-methyl-3-methoxy butanol, 1-methoxy-2-propanol, 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether; esters such as propylene glycol monomethyl ether acetate, propylene glycol monoethyl ether acetate, ethyl lactate, pyruvic acid ethyl, butyl acetate, 3-methoxy methyl propionate, 3-ethoxy ethyl propionate, tert-butyl acetate, tert-butyl propionate, propylene-glycol mono tert-butyl-ether acetate; lactones such as γ-butyrolactone. One of them can be solely used, or two or more of them can be used as a mixture. However, they are not limitative.

In the present invention, diethylene glycol dimethyl ether, 1-ethoxy-2-propanol, propylene-glycol-monomethyl-ether acetate, or a mixture thereof are used preferably among these organic solvents, since the solubility of the acid generating agent in the anti-reflection film material is the most excellent in them.

Preferably, the organic solvent is used in an amount of 400 to 4,000 parts (parts by weight, hereafter it means the same meaning), more preferably 400 to 3,000 parts, to 100 parts of the base resin.

In the anti-reflection film material of the present invention, in order to promote the crosslinking reaction by heat or the like, an acid generating agent can be added further. Any of acid generating agents such as those generating an acid by pyrolysis, or those generating an acid by optical irradiation can be added.

Examples of the acid generating agent used in the present invention may include:
i) an onium salt represented by the following general formulae (P1a-1), (P1a-2), (P1a-3) or (P1b)
ii) a diazomethane derivative represented by the following general formula (P2),
iii) a glyoxime derivative represented by the following general formula (P3),
iv) a bissulfonic derivative represented by the-following general formula (P4),
v) a sulfonate of N-hydroxyimide compound represented by the following general formula (P5),
vi) a β-keto sulfonic acid derivative,
vii) a disulfone derivative,
viii) a nitro benzyl sulfonate derivative,
ix) a sulfonate derivative, or the like.

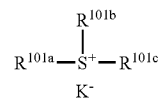

P1a-1

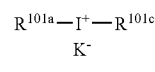

P1a-2

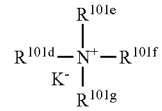

P1a-3

(In the formula, each of $R^{101a}$, $R^{101b}$, and $R^{101c}$ represent a straight, branched, or cyclic alkyl group, alkenyl group, or oxoalkyl group having 1–12 carbon atoms; an aryl group having 6–20 carbon atoms; and an aralkyl group or an aryl oxoalkyl group having 7–12 carbon atoms. Some or all of hydrogen atoms of these groups may be substituted by an alkoxy group or the like. $R^{101b}$ and $R^{101c}$ may form a ring. When a ring may be formed, each of $R^{101b}$ and $R^{101c}$ shows an alkylene group having 1–6 carbon atoms. $K^-$ represents an unnucleophilic counter ion. $R^{101d}$, $R^{101e}$, $R^{101f}$ and $R^{101g}$ is those in which a hydrogen atom is added to $R^{101a}$, $R^{101b}$ and $R^{101c}$. $R^{101d}$ and $R^{101e}$, or $R^{101d}$, $R^{101e}$ and $R^{101f}$ may form a ring. In the case that they form a ring, $R^{101d}$ and $R^{101e}$, or $R^{101d}$ and $R^{101e}$ and $R^{101f}$ represent an alkylene group having 3–10 carbon atoms, or represent an aromatic heterocyclic ring having in the ring a nitrogen atom in the formula.)

Each of $R^{101a}$, $R^{101b}$, $R^{101c}$, $R^{101d}$, $R^{101e}$, $R^{101f}$ and $R^{101g}$ is the same or different. Specific examples of the alkyl group may include: methyl, ethyl, propyl, isopropyl, n-butyl, sec-butyl, tert-butyl, pentyl, hexyl, heptyl, octyl, cyclopentyl, cyclohexyl, cycloheptyl, cyclopropyl methyl, 4-methyl cyclohexyl, cyclohexyl methyl, norbornyl, adamantyl, and the like. Examples of the alkenyl group may include: vinyl, allyl, propenyl, butenyl, hexenyl, cyclohexenyl, and the like. Examples of the oxoalkyl group may include: 2-oxocyclopentyl, 2-oxocyclohexyl, 2-oxopropyl, 2-cyclopentyl-2-oxoethyl, 2-cyclohexyl-2-oxoethyl, 2-(4-methyl cyclohexyl)-2-oxoethyl, and the like. Examples of the aryl group may include: phenyl, naphthyl; and alkoxy phenyl groups, such as p-methoxy phenyl, m-methoxy phenyl, o-methoxy phenyl, ethoxy phenyl, p-tert-butoxy phenyl and m-tert-butoxy phenyl group; alkyl phenyl groups, such as 2-methyl phenyl, 3-methyl phenyl, 4-methyl phenyl, ethyl phenyl, 4-tert-butyl phenyl, 4-butyl phenyl, and dimethyl phenyl; alkyl naphthyl groups, such as methyl naphthyl and ethyl naphthyl; alkoxy naphthyl groups, such as a methoxy naphthyl and ethoxy naphthyl; dialkyl naphthyl groups, such as dimethyl naphthyl and diethyl naphthyl; dialkoxy naphthyl groups, such as dimethoxy naphthyl and diethoxy naphthyl, and the like. Examples of an aralkyl group may include: benzyl, phenylethyl, phenethyl, and the like. Examples of an aryl oxoalkyl group may include: 2-phenyl 2-oxo ethyl groups, such as 2-phenyl-2-oxoethyl, 2-(1-naphthyl)-2-oxoethyl, 2-(2-naphthyl)-2-oxoethyl and the like. Examples of an unnucleophilic counter ion $K^-$ may include: halide ions, such as a chloride ion and a bromide ion; fluoro alkyl sulfonate, such as triflate, 1,1,1-trifluoro ethane sulfonate and nonafluoro butane sulfonate; aryl sulfonate, such as toluenesulfonylate, benzene sulfonate, 4-fluorobenzene sulfonate and 1,2,3,4,5-penta fluorobenzene sulfonate; alkyl sulfonate such as mesylate and butane sulfonate, and the like.

Moreover, examples of an aromatic heterocycle in which $R^{101d}$, $R^{101e}$, $R^{101f}$, and $R^{101g}$ having a nitrogen atom in the formula in a ring may include: an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methyl pyrrolidine, pyrrolidinone, N-methyl pyrolidone and the like), an imidazoline derivatives, an imidazolidine derivative, a pyridine derivative (for example, pyridine, methyl pyridine, ethyl pyridine, propyl pyridine, butyl pyridine, 4-(1-butyl pentyl)pyridine, dimethyl pyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethyl propyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, a uracil derivative, a uridine derivative and the like.

(P1a-1) and (P1a-2) have an effect as both an optical acid generating agent and a thermal acid generating agent, and (P1a-3) acts as a thermal acid generating agent.

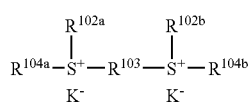

P1b (In the formula, $R^{102a}$ and $R^{102b}$ each represent a straight, branched, or cyclic alkyl group having 1–8 carbon atoms. $R^{103}$ represents a straight, branched, or cyclic alkylene group having 1–10 carbon atoms. $R^{104a}$ and $R^{104b}$ each represent a 2-oxoalkyl group having 3–7 carbon atoms. $K^-$ represents an unnucleophilic counter ion.)

Specific examples of $R^{102a}$ and $R^{102b}$ may include: methyl, ethyl, propyl, isopropyl, n-butyl, sec-butyl, tert-butyl, pentyl, hexyl, heptyl, octyl, cyclopentyl, cyclohexyl, cyclopropyl methyl, 4-methyl cyclohexyl, cyclohexyl methyl, and the like. Examples of $R^{103}$ include: methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, 1,4-cyclohexane dimethylene and the like. Examples of $R^{104a}$ and $R^{104b}$ include: 2-oxopropyl, 2-oxo cyclopentyl, 2-oxocyclohexyl, 2-oxo cycloheptyl, and the like. $K^-$ can be the same as defined for the formula (P1a-1), (P1a-2) and (P1a-3).

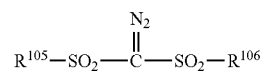

P2

(In the formula, $R^{105}$ and $R^{106}$ represent a straight, branched, or cyclic alkyl group or haloalkyl group having 1–12 carbon atoms, an aryl group or a halo-aryl group having 6–20 carbon atoms, or an aralkyl group having 7–12 carbon atoms.)

Examples of an alkyl group as $R^{105}$ and $R^{106}$ include: methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, adamantyl, and the like. Examples of a haloalkyl group include: trifluoro methyl, 1,1,1-trifluoro ethyl, 1,1,1-trichloroethyl, nonafluorobutyl, and the like. Examples of an aryl group may include: phenyl; an alkoxy phenyl, such as p-methoxy phenyl, m-methoxy phenyl, o-methoxy phenyl, ethoxy phenyl, p-tert-butoxy phenyl, and m-tert-butoxy phenyl; an alkyl phenyl group such as 2-methyl phenyl, 3-methyl phenyl, 4-methyl phenyl, ethyl phenyl, 4-tert-butyl phenyl, 4-butyl phenyl, and a dimethyl phenyl, and the like. Examples of an halo-aryl group include: fluoro phenyl, chloro phenyl, 1,2,3,4,5-pentafluorophenyl and the like. Examples of an aralkyl group include: a benzyl, a phenethyl, and the like.

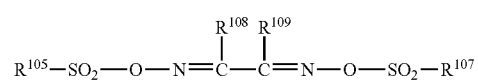

P3

(In the formula, $R^{107}$, $R^{108}$ and $R^{109}$ each represent a straight, branched, or cyclic alkyl group or a haloalkyl group having 1–12 carbon atoms, an aryl group or an halo-aryl group having 6–20 carbon atoms, or an aralkyl group having 7–12 carbon atoms. $R^{108}$ and $R^{109}$ may form together a cyclic structure. In the case that they form a cyclic structure, $R^{108}$ and $R^{109}$ each represent a straight or branched alkylene group having 1–6 carbon atoms. $R^{105}$ represents the same as defined for the formula P2.)

An alkyl group, a halo-alkyl group, an aryl group, a halo-aryl group, and an aralkyl group for $R^{107}$, $R^{108}$, and $R^{109}$ may represent the same as defined for $R^{105}$ and $R^{106}$. Examples of an alkylene group for $R^{108}$ and $R^{109}$ may include: methylene, ethylene, propylene, butylene, hexylene, and the like.

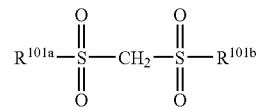

P4

(In the formula, $R^{101a}$ and $R^{101b}$ are the same as defined above.)

P5

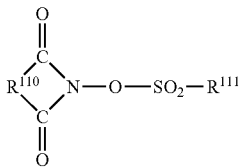

(In the formula, $R^{110}$ represents an arylene group having 6–10 carbon atoms, an alkylene group having 1–6 carbon atoms, or an alkenylene group having 2–6 carbon atoms. Some or all of hydrogen atoms in these groups may be substituted by a straight or branched alkyl group or alkoxy group having 1–4 carbon atoms, nitro, acetyl, or phenyl group. $R^{111}$ represents a straight, branched, or substituted alkyl group, alkenyl group, or alkoxyalkyl group having 1–8 carbon atoms, phenyl or naphthyl. Some or all of hydrogen atoms in these groups may be substituted by an alkyl group or an alkoxy group having 1–4 carbon atoms; phenyl group which may be substituted by an alkyl group or alkoxy group having 1–4 carbon atoms, nitro group, or acetyl group; a hetero aromatic group having 3–5 carbon atoms; a chlorine atom, or a fluorine atom.)

Examples of an arylene group for $R^{110}$ may include: 1,2-phenylene, 1,8-naphthylene, and the like. Examples of an alkylene group for $R^{110}$ may include: methylene, ethylene, trimethylene, tetramethylene, phenylethylene, norbornane-2,3-di-yl, and the like. Examples of an alkenylene group for $R^{110}$ may include: 1,2-vinylene, 1-phenyl-1,2-vinylene, 5-norbornane-2,3-di-yl. Examples of an alkyl group of $R^{111}$ are the same as defined for $R^{101a}$-$R^{101c}$. Examples of an alkenyl group for $R^{110}$ may include vinyl, 1-propenyl, allyl, 1-butenyl, 3-butenyl, isoprenyl, 1-pentenyl, 3-pentenyl, 4-pentenyl, dimethyl allyl, 1-hexenyl, 3-hexenyl, 5-hexenyl,1-heptenyl, 3-heptenyl, 6-heptenyl, 7-octenyl, and the like. Examples of an alkoxy alkyl group may include; methoxy methyl, ethoxy methyl, propoxy methyl, butoxy methyl, pentiloxy methyl, hexyloxy methyl, heptyloxy methyl, methoxy ethyl, ethoxy ethyl, propoxy ethyl, butoxy ethyl, pentyloxy ethyl, hexyloxy ethyl, methoxy propyl, ethoxy propyl, propoxy propyl, butoxy propyl, methoxy butyl, ethoxy butyl, propoxy butyl, methoxy pentyl, ethoxy pentyl, methoxy hexyl, methoxy heptyl, and the like.

Examples of an alkyl group having carbon numbers 1–4 which may be further substituted include: methyl, ethyl, propyl, isopropyl, n-butyl, isobutyl, tert-butyl, and the like. Examples of an alkoxy group having 1–4 carbon atoms include: methoxy, ethoxy, propoxy, isopropoxy, n-butoxy, isobutoxy, tert-butoxy, and the like. Examples of a phenyl group which may be substituted by alkyl group or alkoxy group having 1–4 carbon atoms, nitro, or acetyl include: phenyl, tolyl, p-tert-butoxy phenyl, p-acetyl phenyl, p-nitro phenyl, and the like. Examples of a hetero aromatic group having 3–5 carbon atoms include: pyridyl, furil, and the like.

Specific examples of the acid generating agent may include: onium salts such as trifluoromethane sulfonic acid tetra methyl ammonium, nonafluoro butane sulfonic acid tetra methyl ammonium, nonafluoro butane sulfonic acid triethyl ammonium, nonafluoro butane sulfonic acid pyridinium, camphor sulfonic acid triethyl ammonium, camphor sulfonic acid pyridinium, nonafluoro butane sulfonic acid tetra n-butyl ammonium, nonafluoro butane sulfonic acid tetra phenyl ammonium, p-toluenesulfonic acid tetra methyl ammonium, trifluoromethane sulfonic acid diphenyl iodonium, trifluoromethane sulfonic acid (p-tert-butoxyphenyl) phenyl iodonium, p-toluenesulfonic acid diphenyl iodonium, p-toluenesulfonic acid (p-tert-butoxyphenyl)phenyl iodonium, trifluoromethane sulfonic acid triphenyl sulfonium, trifluoromethane sulfonic acid (p-tert-butoxyphenyl) diphenyl sulfonium, trifluoromethane sulfonic acid bis(p-tert-butoxy phenyl)phenyl sulfonium, trifluoromethane sulfonic acid tris(p-tert-butoxyphenyl)sulfonium, p-toluenesulfonic acid triphenyl sulfonium, p-toluenesulfonic acid (p-tert-butoxy phenyl)diphenyl sulfonium, p-toluenesulfonic acid bis(p-tert-butoxyphenyl)phenyl sulfonium, p-toluenesulfonic acid tris(p-tert-butoxyphenyl)sulfonium, nonafluoro butane sulfonic acid triphenyl sulfonium, butane sulfonic acid triphenyl sulfonium, trifluoromethane sulfonic acid trimethylsulfonium, p-toluenesulfonic acid trimethylsulfonium, trifluoromethane sulfonic acid cyclohexyl methyl (2-oxocyclohexyl)sulfonium, p-toluenesulfonic acid cyclohexyl methyl(2-oxocyclohexyl)sulfonium, trifluoromethane sulfonic acid dimethylphenyl sulfonium, p-toluenesulfonic acid dimethylphenyl sulfonium, trifluoromethane sulfonic acid dicyclohexyl phenyl sulfonium, p-toluenesulfonic acid dicyclohexyl phenyl sulfonium, trifluoromethane sulfonic acid trinaphthyl sulfonium, trifluoromethane sulfonic acid (2-norbonyl)methyl(2-oxocyclohexyl)sulfonium, ethylene bis[methyl(2-oxocyclopentyl) sulfonium trifluoromethane sulfonate], 1,2'-naphthyl carbonyl methyl-tetrahydrothiophenyum triflate, and the like.

Examples of a diazomethane derivative may include; bis(benzene sulfonyl)diazomethane, bis(p-toluenesulfonyl) diazomethane, bis(xylene sulfonyl)diazomethane, bis(cyclohexyl sulfonyl)diazomethane, bis(cyclopentyl sulfonyl)diazomethane, bis(n-butyl sulfonyl)diazomethane, bis(isobutyl sulfonyl)diazomethane, bis(sec-butyl sulfonyl)diazomethane, bis(n-propyl sulfonyl)diazomethane, bis(isopropyl sulfonyl)diazomethane, bis(tert-butyl sulfonyl)diazomethane, bis(n-amyl sulfonyl)diazomethane, bis(isoamyl sulfonyl)diazomethane, bis(sec-amyl sulfonyl)diazomethane, bis(tert-amyl sulfonyl)diazomethane, 1-cyclo hexyl sulfonyl-1-(tert-butyl sulfonyl)diazomethane, 1-cyclo hexyl sulfonyl-1-(tert-amyl sulfonyl)diazomethane, 1-tert-amyl sulfonyl 1-(tert-butyl sulfonyl)diazomethane, and the like.

Examples of a glyoxime derivative include: bis-O-(p-toluenesulfonyl)-α-dimethylglyoxime, bis-O-(p-toluenesulfonyl)-α-diphenyl glyoxime, bis-O-(p-toluenesulfonyl)-α-dicyclohexyl glyoxime, bis-O-(p-toluenesulfonyl)-2,3-penttanedione glyoxime, bis-O-(p-toluenesulfonyl)-2-methyl-3,4-pentanedione glyoxime, bis-O-(n-butane sulfonyl)-α-dimethyl glyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethyl glyoxime, bis-O-(trifluoromethane sulfonyl)-α-dimethyl glyoxime, bis-O-(1,1,1-trifluoroethane sulfonyl)-α-dimethyl glyoxime, bis-O-(tert-butane sulfonyl)-α-dimethyl glyoxime, bis-O-(perfluorooctane sulfonyl)-α-dimethyl glyoxime, bis-O-(cyclohexane sulfonyl)-α-dimethyl glyoxime, bis-O-(benzene sulfonyl)-α-dimethyl glyoxime, bis-O-(p-fluorobenzene sulfonyl)-α-dimethyl glyoxime, bis-O-(p-tert-butylbenzene sulfonyl)-α-dimethyl glyoxime, bis-O-(xylene sulfonyl)-α-dimethyl glyoxime and bis-O-(camphor sulfonyl)-α-dimethyl glyoxime.

Examples of a bis sulfone derivative include: bis naphthyl sulfonyl methane, bis trifluoro methyl sulfonyl methane, bis methyl sulfonyl methane, bis ethyl sulfonyl methane, bis propyl sulfonyl methane, bis isopropyl sulfonyl methane, bis-p-toluenesulfonyl methane, and bis benzene sulfonyl methane.

Examples of a β-keto sulfone derivative include: 2-cyclohexyl carbonyl-2-(p-toluenesulfonyl)propane, 2-isopropyl carbonyl-2-(p-toluenesulfonyl)propane and the like.

Examples of a disulfone derivative include: a diphenyl disulfone derivative, a dicyclohexyl disulfone derivative, and the like.

Examples of a nitro benzyl sulfonate derivative include: p-toluenesulfonic acid 2,6-dinitro benzyl, p-toluenesulfonic acid 2,4-dinitro benzyl, and the like.

Examples of a sulfonate derivative include: 1,2,3-tris (methane sulfonyloxy)benzene, 1,2,3-tris(trifluoromethane sulfonyloxy)benzene, 1,2,3-tris(p-toluene sulfonyloxy)benzene, and the like.

Examples of a sulfonate derivative of an N-hydroxy imide compound include: N-hydroxy succinimide methane sulfonic acid ester, N-hydroxy succinimide trifluoro methane sulfonic acid ester, N-hydroxy succinimide ethane sulfonic acid ester, N-hydroxy succinimide 1-propane sulfonic acid ester, N-hydroxy succinimide 2-propane sulfonic acid ester, N-hydroxy succinimide 1-pentane sulfonic acid ester, N-hydroxy succinimide 1-octane sulfonic acid ester, N-hydroxy succinimide p-toluenesulfonic acid ester, N-hydroxy succinimide p-methoxybenzene sulfonic acid ester, N-hydroxy succinimide 2-chloroethane sulfonic acid ester, N-hydroxy succinimide benzene sulfonic acid ester, N-hydroxy succinimide-2,4,6-trimethyl benzene sulfonic acid ester, N-hydroxy succinimide 1-naphthalene sulfonic acid ester, N-hydroxy succinimide 2-naphthalene sulfonic acid ester, N-hydroxy-2-phenyl succinimide methane sulfonic acid ester, N-hydroxy maleimide methane sulfonic acid ester, N-hydroxy maleimide ethane sulfonic acid ester, N-hydroxy 2-phenyl maleimide methane sulfonic acid ester, N-hydroxy glutarimide methane sulfonic acid ester, N-hydroxy glutarimide benzene sulfonic acid ester, N-hydroxy phthalimide methane sulfonic acid ester, N-hydroxy phthalimide benzene sulfonic acid ester, N-hydroxy phthalimide trifluoro methane sulfonic acid ester, N-hydroxy phthalimide p-toluene sulfonic acid ester, N-hydroxy naphthalimide methane sulfonic acid ester, N-hydroxy naphthalimide benzene sulfonic acid ester, N-hydroxy-5-norbornane-2,3-dicarboxyimide methane sulfonic acid ester, N-hydroxy-5-norbornane-2,3-dicarboxyimide trifluoromethane sulfonic acid ester, N-hydroxy-5-norbornane-2,3-dicarboxyimide p-toluene sulfonic acid ester, and the like.

Especially, there can be preferably used onium salts, such as trifluoromethane sulfonic acid triphenyl sulfonium, trifluoromethane sulfonic acid (p-tert-butoxy phenyl)diphenyl sulfonium, trifluoromethane sulfonic acid tris (p-tert-butoxy phenyl)sulfonium, p-toluenesulfonic acid triphenyl sulfonium, p-toluenesulfonic acid (p-tert-butoxy phenyl)diphenyl sulfonium, p-toluenesulfonic acid tris(p-tert-butoxy phenyl) sulfonium, trifluoromethane sulfonic acid tri naphthyl sulfonium, trifluoromethane sulfonic acid cyclohexyl methyl (2-oxocyclohexyl)sulfonium, trifluoromethane sulfonic acid (2-norbornyl)methyl(2-oxocyclohexyl)sulfonium, and 1,2'-naphthyl carbonyl methyl tetrahydro thiopheneium triflate, diazomethane derivatives, such as bis(benzene sulfonyl) diazomethane, bis(p-toluenesulfonyl)diazomethane, bis(cyclohexyl sulfonyl)diazomethane, bis(n-butyl sulfonyl)diazomethane, bis(isobutyl sulfonyl)diazomethane, bis(sec-butyl sulfonyl)diazomethane, bis(n-propyl sulfonyl) diazomethane, bis (isopropyl sulfonyl)diazomethane, and bis (tert-butyl sulfonyl)diazomethane, glyoxime derivatives, such as bis-O-(p-toluenesulfonyl)-α-dimethyl glyoxime, and bis-O-(n-butane sulfonyl)-α-dimethyl glyoxime, bis sulfone derivatives, such as bis naphthyl sulfonyl methane, a sulfonate derivative of N-hydroxy imide compounds, such as N-hydroxy succinimide methane sulfonic acid ester, N-hydroxy succinimide trifluoromethane sulfonic acid ester, N-hydroxy succinimide 1-propane sulfonic acid ester, N-hydroxy succinimide 2-propane sulfonic acid ester, N-hydroxy succinimide 1-pentane sulfonic acid ester, N-hydroxy succinimide p-toluenesulfonic acid ester, N-hydroxy naphthal imide methane sulfonic acid ester and N-hydroxy naphthal imide benzene sulfonic acid ester, and the like.

The above-mentioned acid generating agent can be used solely or in combination of two or more of them.

An amount of the acid generating agent to be added is 0.1 to 50 parts, more preferably 0.5 to 40 parts to 100 parts of the base polymer (the part is by weight hereafter). If it is fewer than 0.1 parts, an amount of acid generation is few, and a crosslinking reaction may be insufficient. If it exceeds 50 parts, a mixing phenomenon that an acid migrates to the upper photoresist film may be sometimes caused.

Furthermore, it is desirable that the anti-reflection film material of the present invention further contains a crosslinking agent.

As described above, if the anti-reflection film material of the present invention described above further contains a crosslinking agent, a crosslinking reaction in the anti-reflection film is further promoted by baking after application to a substrate or the like.

The crosslinking agent which can be contained in the anti-reflection film material of the present invention is a material which forms a crosslink with polymer using an acid. Examples of them include: a melamine compound, a guanamine compound, a glycol uryl compound or a urea compound, substituted by at least one group selected from a group consisting of a methylol group, an alkoxy methyl group, and acyloxy methyl group, an epoxy compound, an isocyanate compound, an azide compound, a compound having a double bond such as an alkenyl ether group, and the like.

Examples of an epoxy compound among the above-mentioned compounds include: tris(2,3-epoxy propyl)isocyanurate, tri methylol methane tri glycidyl ether, trimethylol propane tri glycidyl ether, tri ethylol ethane triglycidyl ether, and the like. Specific examples of a melamine compound include: hexamethylol melamine, hexamethoxy methyl melamine, and a compound in which 1–6 of methylol groups of hexamethylol melamine is methoxy methylated, or a mixture thereof, hexamethoxy ethyl melamine, hexaacyloxy methyl melamine, and a compound in which 1–5 of methylol groups of hexamethylol melamine is acyloxy methylated, or a mixture thereof. Examples of a guanamine compound include: tetramethylol guanamine, tetra methoxy methyl guanamine, a compound in which 1–4 of methylol groups of a tetramethylol guanamine is methoxy methylated or a mixture thereof, tetra methoxy ethyl guanamine, tetra acyloxy guanamine, and a compound in which 1–4 of methylol groups of tetramethylol glycol is acyloxy methylated or a mixture thereof. Examples of a glycol uryl compound include: tetramethylol glycol uryl, tetra methoxy glycol uryl, tetra methoxy methyl glycol uryl, a compound in which 1–4 of the methylol groups of tetramethylol glycol uryl is metoxy methylated, or a mixture thereof and a compound in which 1–4 of the methylol groups of tetrametylol glycol uryl is acyloxy methylated or a mixture thereof. Examples of a urea compound include: tetramethylol urea, tetramethoxy methyl urea, and a compound in which 1–4 of methylol groups of tetramethylol urea are methoxy methylated or a mixture thereof, tetramethoxy ethyl urea, and the like.

Examples of an isocyanate compound include: tolylene diisocyanate, a diphenylmethane diisocyanate, hexamethylene diisocyanate, cyclohexane diisocyanate, and the like. Examples of an azide compound include: 1,1'-biphenyl-4,4'-bis azide, 4,4'-methylidene bis azide, and 4,4'-oxy-bis azide.

Examples of a compound containing a alkenyl ether group include: ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane tri vinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, trimethylol propane trivinyl ether, and the like.

When $R^1$ in the general formula (1), (2) and (3) contains epoxy as a crosslink group, in order to raise reactivity with epoxy and to raise an efficiency of crosslinking, it is effective to add a compound containing a hydroxy group. As the additive, a compound which contains two or more hydroxy groups in a molecule is especially desirable. Examples of the additive may include: a compound having an alcohol group such as 4,8-bis(hydroxy methyl)tricyclo [5.2.1.02,6]-decane, pentaerythritol, 1,2,6-hexanetriol, 4,4',4''-methylidene tris cyclohexanol, 4,4'-[1-[4-[1-(4-hydroxy cyclohexyl)-1-methylethyl]phenyl]ethylidene]biscyclohexanol, [1,1'-bicyclhexyl]-4,4'-diol, methylene biscyclohexanol, deacahydronaphthalene-2,6-diol, [1,1'-bicyclohexyl]-3,3',4,4'-tetrahydroxy or the like; and a phenol containing less benzene nuclei, such as bisphenol, methylene bisphenol, 2,2'-methylene bis[4-methyl phenol], 4,4'-methylidene-bis[2,6-dimethylphenol], 4,4'-(1-methyl-ethylidene)bis[2-methyl phenol], 4,4'-cyclohexylidene bisphenol, 4,4'-(1,3-dimethyl butylidene)bisphenol, 4,4'-(1-methyl-ethylidene)bis[2,6-dimethyl phenol], 4,4'-oxybisphenol, 4,4'-methylene bisphenol, bis(4-hydroxy phenyl)methanone, 4,4'-methylene bis[2-methyl phenol], 4,4'-[1,4-phenylene bis(1-methyl ethylidene)]bisphenol, 4,4'-(1,2-ethane-di-yl)bisphenol, 4,4'-(diethyl silylene)bisphenol, 4,4'-[2,2,2-trifluoro-1-(trifluoromethyl)ethylidene]bisphenol, 4,4',4''-methylidene trisphenol, 4,4'-[1-(4-hydroxyphenyl)-1-methylethyl]phenyl]ethylidene]bisphenol, 2,6-bis[(2-hydroxy-5-methylphenyl)methyl]-4-methyl phenol, 4,4',4''-ethylidyne tris [2-methyl phenol], 4,4',4''-ethylidyne trisphenol, 4,6-bis[(4-hydroxy phenyl)methyl]1,3-benzene diol, 4,4'-[(3,4-dihydroxy phenyl)methylene]bis[2-methylphenol], 4,4',4'',4'''-(1, 2-ethanediylidene)tetrakisphenol, 4,4',4'',4'''-ethane diylidene tetrakis[2-methylphenol], 2,2'-methylene bis [6-[(2-hydroxy-5-methylphenyl)methyl]-4-methylphenol], 4,4',4'',4'''-(1,4-phenylene dimethylidyne)tetrakisphenol, 2,4,6-tris (4-hydroxy phenylmethyl)1,3-benzenediol, 2,4',4''-methylidene trisphenol, 4,4',4'''-(3-methyl-1-propanyl-3-ylidene)trisphenol, 2,6-bis [(4-hydroxy-3-fluorophenyl)methyl]-4-fluorophenol, 2,6-bis [4-hydroxy 3-fluorophenyl]methyl]-4-fluorophenol, 3,6-bis [(3,5-dimethyl 4-hydroxy phenyl)methyl]1,2-benzenediol, 4,6-bis[(3,5-dimethyl 4-hydroxy phenyl)methyl]1,3-benzene diol, p-methylcalics [4]allene, 2,2'-methylene bis [6-[(2,5/3,6-dimethyl-4/2-hydroxy phenyl)methyl]-4-methyl phenol, 2,2'-methylene bis [6-[(3,5-dimethyl-4-hydroxyphenyl)methyl]-4-methyl phenol, 4,4',4'',4'''-tetrakis[(1-methyl ethylidene)bis(1,4-cyclohexylidene)]-phenol, 6,6'-methylene bis [4-(4-hydroxy phenyl methyl)-1,2,3-benzentriol, 3,3',5,5'-tetrakis [(5-methyl-2-hydroxyphenyl)methyl]-[(1,1'-biphenyl)-4,4'-diol] or the like.

An amount of the hydroxy containing additive to be blended in the present invention is desirably 5–50 parts by weight, and especially 10–40 parts by weight per 100 parts by weight of a total resin. If it is less than 5 parts by weights, mixing with a resist may be caused. If it is more than 50 parts by weights, the reflection preventive effect may be lowered or a crack may be caused in the film after a crosslinking, in some cases.

The present invention also provides a method of forming a pattern on a substrate by lithography comprising at least applying to the substrate an anti-reflection film material of the present invention and baking the anti-reflection film material to form an anti-reflection film, applying to the anti-reflection film a photoresist film material and pre-baking the photoresist film material to form a photoresist film, exposing the pattern circuit range of the photoresist film, developing with a developer to form a resist pattern on the photoresist film, and etching the anti-reflection film and the substrate using as a mask the photoresist film on which the resist pattern is formed to form a pattern on the substrate.

Furthermore, the present invention provides a method of forming a pattern on a substrate with lithography comprising at least, applying to the substrate an anti-reflection film material of the present invention and baking the anti-reflection film material to form an anti-reflection film, applying to the anti-reflection film a photoresist film material and pre-baking the photoresist film material to form the photoresist film, exposing a pattern circuit range of the photoresist film, developing with a developer to form a resist pattern on the photoresist film, etching the anti-reflection film using as a mask the photoresist film on which the resist pattern is formed as a mask, and etching the substrate using as a mask the anti-reflection film on which a pattern is formed to form a pattern on the substrate.

These methods for forming a pattern will be explained with referring to FIG. 2.

First, the steps to formation of a resist pattern shown in FIG. 2(a) will be explained.

The anti-reflection film 10 can be formed by applying an anti-reflection film material of the present invention to a substrate 12 by a spin-coating method or the like. After applied by a spin-coating method or the like, it is preferable to evaporate organic solvent and bake the anti-reflection film material to accelerate crosslinking reaction in order to prevent mixing with the photoresist film 11 which serves as the upper layer. A baking temperature is preferably in the range of 80–300° C., and baking time is preferably in the range of 10 to 300 seconds.

After forming the anti-reflection film 10, the photoresist film 11 is formed thereon. A spin-coating method is preferably used therefor, as in formation of the anti-reflection film. Pre-baking is performed after applying a photoresist film material by a spin-coating or the like. The pre-baking condition is preferably that the time is in the range of 10 to 300 seconds and the temperature is in the range of 80 to 180° C. Then, a pattern circuit range is exposed, followed by post exposure baking (PEB) and development with a developer, and thereby a resist pattern is obtained (FIG. 2(a)).

Next, the steps to formation of the pattern shown in FIG. 2(b) will be explained.

In order to etch the anti-reflection film 10 using the photoresist film 11 as a mask, etching is performed using flon gas, nitrogen gas, carbon dioxide gas, or the like. The anti-reflection film 10 made from the anti-reflection film material of the present invention has characteristics that a etch rate to the above-mentioned gas is high, and a film decrease of the photoresist film 11 formed on it is small.

The following etching of a substrate 12 is performed using mainly flon gas in the case that a layer 12a to be processed on a ground layer 12b is $SiO_2$ or SiN, and chlorine gas or bromine gas in the case that it is p-Si, aluminum or W. The anti-reflection film 10 formed from the anti-reflection film material of the present invention is excellent in an etching resistance over chlorine and bromine, and especially in the case that a layer to be processed is p-Si, aluminum, W, or the like, it can also be used as a hard mask. An etching rate of the anti-reflection film 10 made from the anti-reflection film material of the present invention is higher than the photoresist film 11 and lower than a substrate 12 in the case that a processing layer 12a is $SiO_2$ or SiN, and thus the film may function as a hard mask.

Therefore, when a pattern is formed by etching removal of the processing layer 12a of a substrate 12, the photoresist film 11 can be used as a mask. Alternatively, the anti-reflection film 10 on which the pattern is formed can be used as a mask for processing.

Furthermore, the present invention provides a method for forming a pattern on a substrate by lithography comprising at least forming an organic film on the substrate, applying an anti-reflection film material of the present invention to the organic film and baking the anti-reflection film material to form an anti-reflection film, applying to the anti-reflection film a photoresist film material and pre-baking the photoresist film material to form a photoresist film, exposing a pattern circuit range of the photoresist film, developing with a developer to form a resist pattern on the photoresist film, etching the anti-reflection film with using as a mask the photoresist film on which the resist pattern is formed, etching the organic film with using as a mask the anti-reflection film on which the pattern is formed, and etching the substrate to form a pattern on the substrate.

Figure 3:
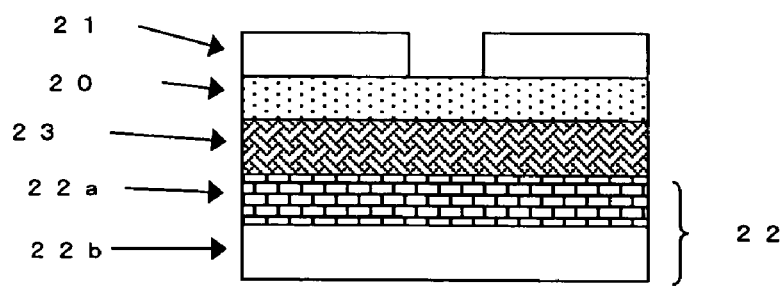
FIG. 3 is an explanatory view of another method for forming a pattern of the present invention.
(a) the resist pattern after development,
(b) the pattern transferred to the anti-reflection film,
(c) the pattern transferred to the organic film,
(d) the pattern after a substrate dry etching.
Figure 3:
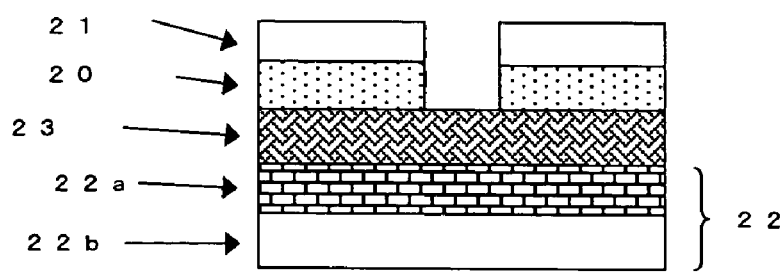
Figure 3:
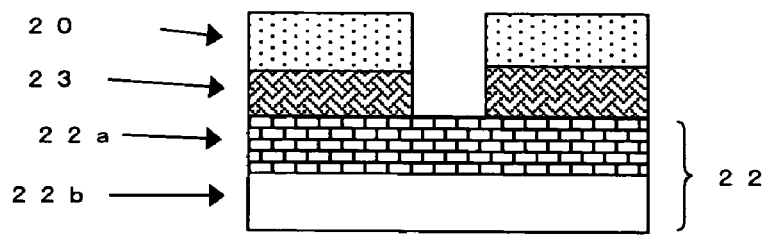
Figure 3:
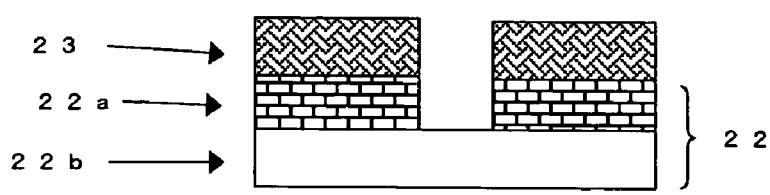

As described above, the anti-reflection film formed from the anti-reflection film material of the present invention can also be used as an interlayer in the multilayer-resist process, for example, in a three-layer resist process. The method of forming a pattern will be explained with reference to FIG. 3.

First, the steps to formation of a resist pattern shown in FIG. 3(a) will be explained.

An organic film 23 is formed by a spin-coating method or the like on a substrate 22. Since the organic film 23 acts as a mask when etching a substrate 22, preferably it has an excellent etching resistance. Furthermore, since it needs not to be mixed with the upper silicon containing anti-reflection film 20, it is desirable that it is crosslinked by heat or acid after being applied. On the organic film 23, the anti-reflection film 20 formed from the anti-reflection film material of the present invention and the photoresist film 21 are formed according to the method similar to the method described above. Thereafter, the resist pattern can be obtained by exposure of a pattern circuit range, and development in a developer (FIG. 3(a)).

Examples of the organic film may include: resins such as cresol novolak, naphthol novolak, catordicyclopentadiene novolak, amorphous carbon, polyhydroxy styrene, (meta) acrylate, polyimide, polysulfone, and the like.

Next, as shown in FIG. 3(b), the anti-reflection film 20 is etched using as a mask the photoresist film 21 on which a pattern is formed, and a resist pattern is transferred to the anti-reflection film 20. Next, as shown in FIG. 3(c), the pattern formed on the anti-reflection film 20 is transferred to the organic film 23 by oxygen plasma etching or the like. At this time, the photoresist film 21 is also removed by etching simultaneously. Then, as shown in FIG. 3(d), etching of the processing layer 22a on a ground layer 22b is performed, and thereby a pattern is formed on the substrate 22.

EXAMPLES

The present invention will be specifically explained below with referring to Preparation examples, Comparative preparation examples, Examples and Comparative examples. However, the present invention is not limited to the description in them.

Preparation Example 1

23.6 g of 3-glycidoxy propyl trimethoxy silane, 19.8 g of phenyl trimethoxy silane, and 22.3 g of 3-acetoxypropyltri methoxy silane were dissolved in 200 g of tetrahydrofuran (THF) and 100 g of pure water, and a liquid temperature was made into 35° C. Then, 21 g of 37% hydrochloric acid water was dropped over 1 hour, and then a temperature was raised to 64° C., to perform a condensation reaction of silanol, a ring-opening reaction of an epoxy group and an addition reaction of hydrochloric acid.

200 g of diethyl ether was added to the above-mentioned reaction mixture, and the water phase was separated from the organic phase. The organic phase was washed twice with ultrapure water, and then 200 g of propylene-glycol-monomethyl-ether acetate (PGMEA) was added thereto. THF and diethyl ether water were removed under the reduced pressure with heating a liquid temperature at 60° C., and thereby Polymer 1 shown below was obtained.

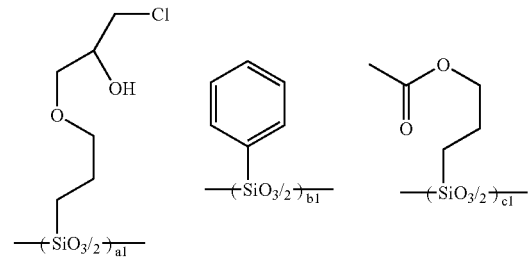

Polymer 1

The molecular weight (Mw) as converted to polystyrene was calculated by gel permeation chromatography (GPC), and a copolymerization ratio was obtained as follows by $C^{13}$-NMR.

Molecular weight (Mw)=3300 Copolymerization ratio a1:b1:c1=0.35:0.3:0.35

Preparation Example 2

23.6 g of 3-glycidoxy propyl trimethoxy silane, 19.8 g of phenyl trimethoxy silane, and 22.3 g of 3-acetoxypropyl trimethoxy silane were dissolved in 200 g of tetrahydrofuran and 100 g of pure water, and a liquid temperature was made to 35° C. Then, 9.6 g of 70% nitric acid was dropped over 1 hour, and then the temperature was raised to 64° C., to perform a condensation reaction of silanol and a ring-opening reaction of an epoxy group.

200 g of diethyl ether was added to the above-mentioned reaction mixture, and the water phase was separated from the organic phase. The organic phase was washed twice with ultrapure water, and then 200 g of propylene-glycol-monomethyl-ether acetate (PGMEA) were added thereto. THF and diethyl ether water were removed under the reduced pressure with heating the liquid temperature at 60° C., and thereby the Polymer 2 shown below was obtained.

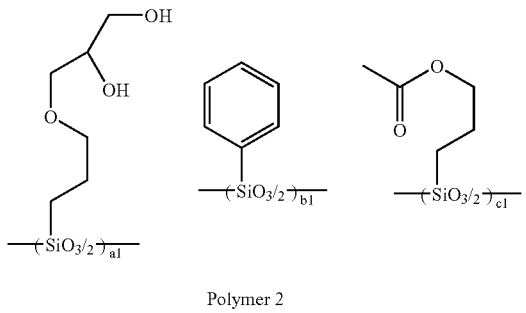

Polymer 2

The molecular weight (Mw) as converted to polystyrene was calculated by gel permeation chromatography (GPC), and a copolymerization ratio is obtained as follows by $C^{13}$-NMR.

Molecular weight (Mw)=3100 Copolymerization ratio a1:b1:c1=0.3:0.3:0.4

Preparation Example 3

24.6 g of 2-(3,4-epoxy cyclohexyl)ethyl trimethoxy silane, 19.8 g of phenyl trimethoxy silane, and 17.2 g of 2-cyano ethyl trimethoxy silane were dissolved in 200 g of tetrahydrofuran and 100 g of pure water, and a liquid temperature was made to 35° C. Then 1.7 g of tetramethyl ammonium hydroxide was added, and then the temperature was raised to 60° C., to perform a condensation reaction of silanol.

200 g of diethyl ether was added to the above-mentioned reaction mixture, the water phase was separated from the organic phase. The organic phase was washed twice with 1% aqueous acetic acid and ultrapure water, and then 200 g of propylene-glycol-monomethyl-ether acetate (PGMEA) was added thereto. THF and diethyl ether water were removed under the reduced pressure with heating liquid temperature at 60° C., and thereby Polymer 3 shown below was obtained.

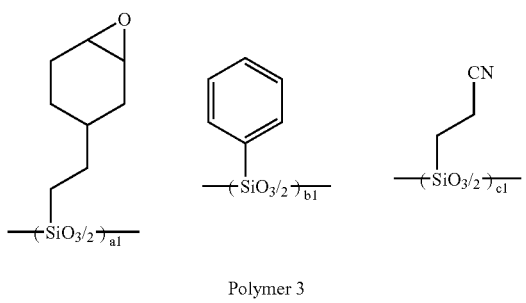

Polymer 3

The molecular weight (Mw) as converted to polystyrene was calculated by the gel permeation chromatography (GPC), and the copolymerization ratio was obtained as follows by $C^{13}$-NMR.

Molecular weight (Mw)=2500 Copolymerization ratio a1:b1:c1=0.26:0.31:0.43

Preparation Example 4

23.6 g of 3-glycidoxy propyl trimethoxy silane, 19.8 g of phenyl trimethoxy silane, and 22.3 g of 3-butyl acid methyltrimethoxy silane were dissolved in 200 g of tetrahydrofuran and 100 g of pure water, and the liquid temperature was made into 35° C. 9.6 g of 70% nitric acid was dropped over 1 hour, and then the temperature was raised to 64° C., to perform a condensation reaction of silanol and a ring-opening reaction of an epoxy group.

200 g of diethyl ether was added to the above-mentioned reaction mixture, the water phase was separated from the organic phase. The organic phase was washed twice with ultrapure water, and then 200 g of propylene-glycol-monomethyl-ether acetate (PGMEA) was added thereto. THF and diethyl ether water were removed under the reduced pressure with heating a liquid temperature at 60° C., and thereby the Polymer 4 shown below was obtained.

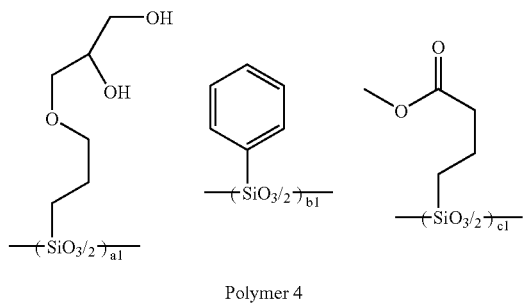

Polymer 4

The molecular weight (Mw) as converted to polystyrene was calculated by gel permeation chromatography (GPC), and a copolymerization ratio was obtained as follows by $C^{13}$-NMR.

Molecular weight (Mw)=3800 Copolymerization ratio a1:b1:c1=0.42:0.28:0.30

Preparation Example 5

15.9 g of tris(trimethyl silyl)silylethyl trimethoxy silane, 28.3 g of 3-glycidoxy propyl triethoxy silane, and 22.3 g of 3-acetoxypropyl trimethoxy silane were dissolved in 200 g of tetrahydrofuran and 100 g of pure water, and liquid temperature was made into 35° C. 9.6 g of 70% nitric acid was dropped over 1 hour, and then the temperature was raised to 64° C., to perform a condensation reaction of silanol and a ring-opening reaction of an epoxy group.

200 g of diethyl ether was added to the above-mentioned reaction mixture, the water phase was separated from the organic phase. The organic phase was washed twice with ultrapure water, and then 200g of propylene-glycol-monomethyl-ether acetate (PGMEA) were added thereto. THF and diethyl ether water were removed under the reduced pressure with heating at a liquid temperature of 60° C., and thereby the Polymer 5 shown below was obtained.

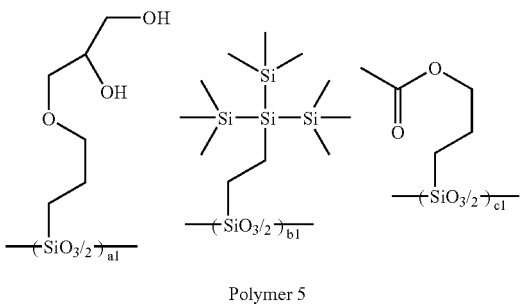

Polymer 5

The molecular weight (Mw) as converted to polystyrene was calculated by gel permeation chromatography (GPC), and the copolymerization ratio was obtained as follows by $C^{13}$-NMR.

Molecular weight (Mw)=2500 Copolymerization ratio a1:b1:c1=0.34:0.38:0.28

Preparation Example 6

23.6 g of 3-glycidoxy propyl trimethoxy silane, 19.8 g of phenyl trimethoxy silane, and 12 g of methanol were dissolved in tetrahydrofuran 200 g and 100 g of pure water, and liquid temperature was made into 35° C. 9.6g of 70% nitric acid was dropped over 1 hour, and then the temperature was raised to 64° C., to perform a condensation reaction of silanol, a ring-opening reaction of an epoxy group, and methoxylation.

200 g of diethyl ether was added to the above-mentioned reaction mixture, the water phase was separated from the organic phase. The organic phase was washed twice with ultrapure water, and then 200 g of propylene-glycol-monomethyl-ether acetate (PGMEA) were added thereto. THF and diethyl ether water were removed under the reduced pressure with heating at a liquid temperature of 60° C., and thereby the Polymer 6 shown below was obtained.

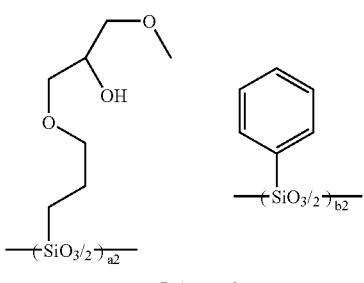

Polymer 6

The molecular weight (Mw) as converted to polystyrene was calculated by gel permeation chromatography (GPC), and the copolymerization ratio was obtained as follows by $C^{13}$-NMR.

Molecular weight (Mw)=4200 Copolymerization ratio a2:b2=0.65:0.35

Preparation Example 7

23.6 g of 3-glycidoxy propyl trimethoxy silane and 48.8 g of 2-acetoxypropyl trimethoxy silane were dissolved in 200 g of tetrahydrofuran and 100 g of pure water, and liquid temperature was made into 35° C. 9.6 g of 70% nitric acid was dropped over 1 hour, and then the temperature was raised to 64° C., to perform a condensation reaction of silanol and a ring-opening reaction of an epoxy group.

200 g of diethyl ether was added to the above-mentioned reaction mixture, the water phase was separated from the organic phase. The organic phase was washed twice with ultrapure water and then 200 g of propylene-glycol-monomethyl-ether acetate (PGMEA) were added thereto. THF and diethyl ether water were removed under the reduced pressure with heating at a liquid temperature of 60° C., and thereby the Polymer 7 shown below was obtained.

Polymer 7

The molecular weight (Mw) as converted to polystyrene was calculated by gel permeation chromatography (GPC), and the copolymerization ratio was obtained as follows by $C^{13}$-NMR.

Molecular weight (Mw)=4500 Copolymerization ratio a3:c2=0.28:0.72

Preparation Example 8

24.6 g of 2-(3,4-epoxy cyclohexyl)ethyl trimethoxy silane, 19.8 g of phenyl trimethoxy silane, and 28.6 g of spiro [2-oxooxolane-3,5,-bicyclo[2.2.1]heptane trimethoxy silane] were dissolved in 200 g of tetrahydrofuran and 100 g of pure water, and a liquid temperature was made into 35° C. Then, 1.7 g of tetramethyl ammonium hydroxide was added thereto, and then the temperature was raised to 60° C., to perform the condensation reaction of silanol.

200 g of diethyl ether was added to the above-mentioned reaction mixture, and the water phase was separated from the organic phase. The organic phase was washed twice with 1% aqueous acetic acid and ultrapure water, and then 200 g of propylene-glycol-monomethyl-ether acetate (PGMEA) was added thereto. THF and diethyl ether water were removed under the reduced pressure with heating at a liquid temperature of 60° C., and thereby the Polymer 8 shown below was obtained.

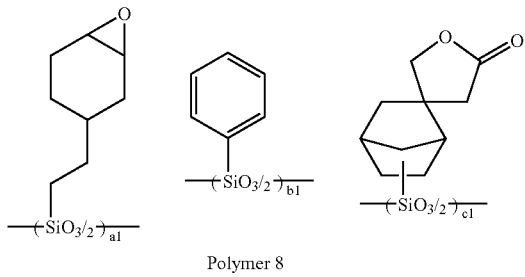

Polymer 8

The molecular weight (Mw) as converted to polystyrene was calculated by gel permeation chromatography (GPC), and a copolymerization ratio was obtained as follows by $C^{13}$-NMR.

Molecular weight (Mw)=2300 Copolymerization ratio a1:b1:c1=0.32:0.30:0.38

Comparative Example 1

39.6 g of phenyl trimethoxy silane, 28.3 g of 3-glycidoxy propyl triethoxy silane, and 12 g of methanol were dissolved in 200 g of tetrahydrofuran (THF) and 100 g of pure water, and then a liquid temperature was made into 35° C. 21 g of 37% hydrochloric acid water was dropped over 1 hour, and then the temperature was raised to 64° C., to perform the condensation reaction of silanol, the ring-opening reaction of an epoxy group, and the methoxylation reaction.

200 g of diethyl ether was added to the above-mentioned reaction mixture, and the water phase was separated from organic phase. The organic phase was washed twice with ultrapure water, and then 200 g of propylene-glycol-monomethyl-ether acetate (PGMEA) were added thereto. THF and diethyl ether water were removed under the reduced pressure with heating at a liquid temperature of 60° C., and thereby the Comparative polymer 1 shown below was obtained.

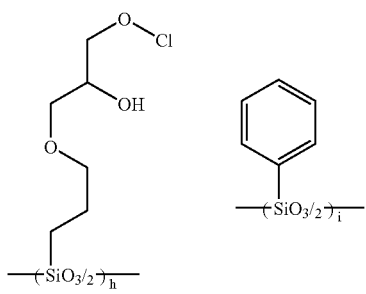

Comparative polymer 1

The molecular weight (Mw) as converted to polystyrene was calculated by gel permeation chromatography (GPC), and it asked for the copolymerization ratio as follows by $C^{13}$-NMR.

Molecular weight (Mw)=4500 Copolymerization ratio h:i=0.72:0.28

Examples, Comparative Examples

[Preparation of an Anti-Reflection Film Material]

The anti-reflection film materials (Examples 1–9, Comparative example 1) were prepared by dissolving each of the polymer compounds obtained in the above-mentioned Preparation examples 1–8 and Comparative example 1 in the organic solvent containing 0.1% by weight of FC-430 (manufactured by Sumitomo 3M corporation) at a rate shown in Table 1, and filtering it with a 0.1 μm filter made of fluororesin.

Each of the compositions in Table 1 is as follows.

Polymer 1–8: Preparation examples 1–8,

Comparative polymer 1: Comparative preparation example 1

Crosslinking agent: CR1, CR2, OH-Additive 1 (see the following structural formula)

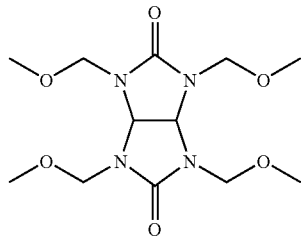

CR1

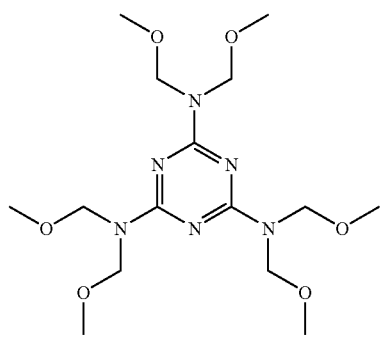

CR2

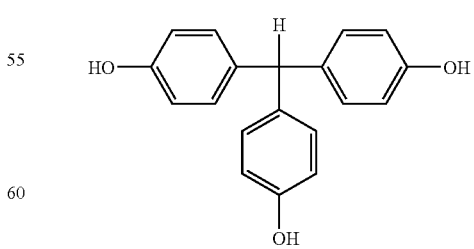

OH-Additive1

Acid generating agent: AG1, AG2 (see the following structural formula)

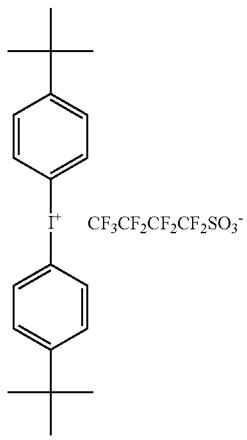

AG1

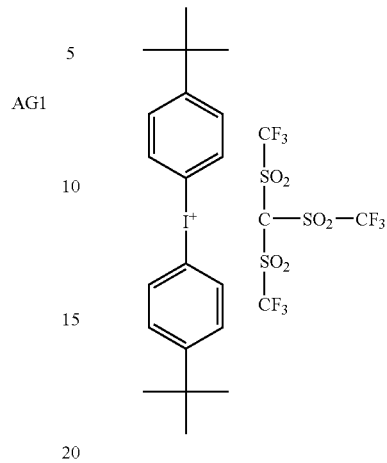

AG2

Organic solvent: PGMEA (propylene-glycol-monomethyl-ether acetate).

The anti-reflection film material prepared as described above was applied on the silicon substrate, and baked for 120 seconds at 200° C., to form the anti-reflection film with a thickness of 193 nm.

After forming the anti-reflection film, the refraction index (n, k) of the anti-reflection film at a wavelength of 193 nm was measured using the incident light angle variable spectrum elipsometer (VASE) manufactured by J. A. Uhram corporation. The results were shown in Table 1.

TABLE 1

| | Polymer (Parts by weight) | Crosslinking Agent (Parts by weight) | Acid generating agent (Parts by weight) | Organic solvent (Parts by weight) | refraction index at a wavelength of 193 nm | |
|---|---|---|---|---|---|---|
| | | | | | n value | k value |
| Example 1 | Polymer1(10) | CR1 (2) | AG1 (0.2) | PGMEA(100) | 1.81 | 0.20 |
| Example 2 | Polymer2(10) | CR (2) | AG1 (0.2) | PGMEA(100) | 1.78 | 0.21 |
| Example 3 | Polymer3(10) | — | AG1 (0.2) | PGMEA(100) | 1.77 | 0.28 |
| Example 4 | Polymer3(10) | OH - Additivel (1) | AG1 (0.2) | PGMEA(100) | 1.75 | 0.32 |
| Example 5 | Polymer4(10) | CR1 (2) | AG1 (0.2) | PGMEA(100) | 1.78 | 0.25 |
| Example 6 | Polymer5(10) | CR1 (2) | AG1 (0.2) | PGMEA(100) | 1.68 | 0.18 |
| Example 7 | Polymer6(5.0) Polymer7(5.0) | CR1 (2) | AG1 (0.2) | PGMEA(100) | 1.62 | 0.30 |
| Example 8 | Polymer2(10) | CR1 (2) | AG2 (0.2) | PGMEA(100) | 1.77 | 0.23 |
| Example 9 | Polymer8(10) | CR1 (2) | AG2 (0.2) | PGMEA(100) | 1.72 | 0.22 |
| Comparative Example 1 | Comparative Polymer1(10) | CR1 (2) | AG1 (0.2) | PGMEA(100) | 1.60 | 0.30 |

As shown in Table 1, the n value of a refraction index was 1.5–1.9, and the k values was 0.15 or more, in the anti-reflection film of Examples 1–9 and Comparative example 1. Thus, it was found that it has the optimal n value and k value which can achieve the sufficient reflection preventive effect.

[Preparation of the Photoresist Film Material]

The following polymers (Polymer A-Polymer C) were prepared as a base resin of the photoresist film material.

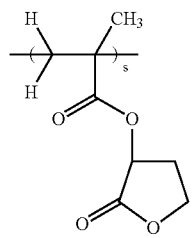
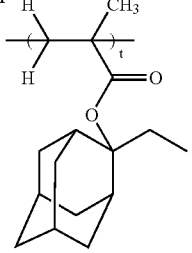

Polymer A

Polymer A is a polymer which consists of the repeating units s and t shown above. The copolymerization ratio and weight average molecular weight (Mw) of the polymer are shown below.

Copolymerization ratio s:t=0.40:0.60 Molecular weight (Mw)=8800

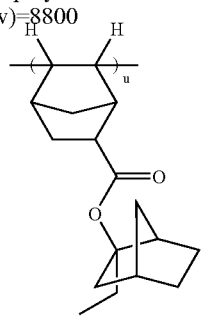
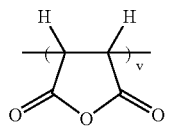

Polymer B

Polymer B is a polymer which consists of repeating units u and v shown above. The copolymerization ratio and weight average molecular weight (Mw) of this polymer are shown below.

A copolymerization ratio u:v=0.50:0.50 Weight-average-molecular-weight (Mw)=8300

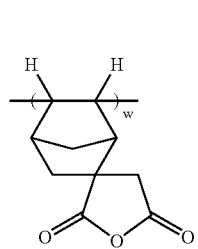
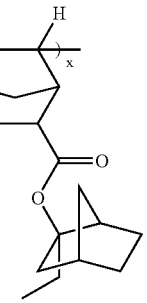

Polymer C

Polymer C is a polymer which consists of the repeating units w and x shown above. The copolymerization ratio and weight average molecular weight (Mw) of this polymer are shown below.

A copolymerization ratio w:x=0.40:0.60 Weight-average-molecular-weight (Mw)=18300

The photoresist film materials 1–3 for ArF lithography having a composition shown in the following Table 2 were prepared using the polymers (Polymer A-Polymer C) prepared as described above, respectively. Each composition in Table 2 is as follows.

Polymer: Polymer A-Polymer C,

Acid generating agent: PAG1 (see the following structural formula),

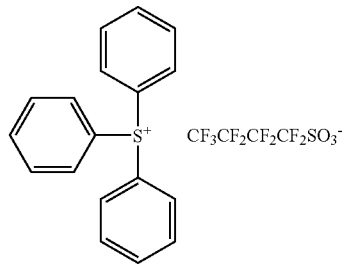

PAG1

Base additive: triethanolamine,

Organic solvent: PGMEA (propylene-glycol-monom-ethyl-ether acetate).

TABLE 2

| | Polymer (Parts by weight) | Acid generating agent (Parts by weight) | Base additive (Parts by weight) | Organic solvent (Parts by weight) |
|---|---|---|---|---|
| Photoresist film material1 | Polymer A (100) | PAG1 (2.0) | Triethanolamine (0.2) | PGMEA (6000) |
| Photoresist film material2 | Polymer B (100) | PAG1 (2.0) | Triethanolamine (0.2) | PGMEA (6000) |
| Photoresist film material3 | Polymer C (100) | PAG1 (2.0) | Triethanolamine (0.2) | PGMEA (6000) |

[Observation of a Pattern Configuration, and Etching Resistance Test]

(1) Observation of a Pattern Configuration

The anti-reflection film materials (Examples 1–9, Comparative example 1) prepared as described above were applied to the silicon substrate and baked for 120 seconds at 200° C., to form the anti-reflection film having a thickness of 193 nm.

Then, to the anti-reflection film, the photoresist film materials 1–3 prepared as described above were applied in the combination shown in Table 3, and baked for 60 seconds at 120° C., and the photoresist film with a thickness of 250 nm was formed.

Subsequently, it was exposed by the ArF exposing apparatus (S305B, NA0.68, σ0.85, ⅔ ring lighting, Cr mask, manufactured by Nikon), baked (PEB) for 90 seconds at 110° C., and developed in 2.38% by weight of aqueous solution of tetra methyl ammonium hydroxide (TMAH), to provide a 0.13 μm line and space positive resist pattern. The configuration of the obtained resist pattern (a cross-sectional configuration of the photoresist film) was observed whether there were caused footing profile, undercut, and intermixing phenomenon. The results were shown in Table 3.

TABLE 3

| Anti-reflecting film material | Photoresist film material | 130 nm line and space resist pattern shape |
|---|---|---|
| Example 1 | Photoresist film material 1 | Perpendicular No footing profile |
| Example 2 | Photoresist film material 1 | Perpendicular No footing profile |
| Example 3 | Photoresist film material 1 | Perpendicular No footing profile |
| Example 4 | Photoresist film material 1 | Perpendicular No footing profile |
| Example 5 | Photoresist film material 1 | Perpendicular No footing profile |
| Example 6 | Photoresist film material 1 | Perpendicular No footing profile |
| Example 7 | Photoresist film material 1 | Perpendicular No footing profile |
| Example 8 | Photoresist film material 1 | Perpendicular No footing profile |
| Example 9 | Photoresist film material 1 | Perpendicular No footing profile |
| Example 1 | Photoresist film material 2 | Perpendicular No footing profile |
| Example 1 | Photoresist film material 3 | Perpendicular No footing profile |
| Comparative example 1 | Photoresist film material 1 | A little bit reverse taper, Footing profile |

Consequently, it was confirmed that, in the case where the anti-reflection film materials of Examples 1–9 were used, footing profile, undercut, and inter-mixing phenomenon did not occur in the photoresist film near the boundary with an anti-reflection film, but a rectangular pattern was obtained. However, when the anti-reflection film material of Comparative example 1 was used, reverse taper and footing profile were observed a little.

(2) Etching Resistance Test

The etching resistance of the anti-reflection films formed from the above-mentioned anti-reflection film materials (Examples 1–9, Comparative example 1), and the photoresist films formed from the above-mentioned photoresist film materials (photoresist film materials 1–3) were evaluated under the two following conditions.

1) Etching Test with $CHF_3/CF_4$ Gas

A thickness difference before and after etching of the anti-reflection film, the photoresist films and the $SiO_2$ film were measured using a dry etching system TE-8500P manufactured by Tokyo Electron Co., Ltd.

Etching conditions are shown below.

| Chamber pressure | 40 Pa |
|---|---|
| RF power | 1300 W |
| Gap | 9 mm |
| Gas flow amount of $CHF_3$ | 30 ml/min |
| Gas flow amount of $CF_4$ | 30 ml/min |
| Gas flow amount of Ar | 100 ml/min |
| Time | 10 sec |

The results were shown in Table 4.

TABLE 4

| Film material etc | $CHF_3/CF_4$ gas etching rate (nm/min) |
|---|---|
| Example 1 | 265 |
| Example 2 | 285 |
| Example 3 | 221 |
| Example 4 | 254 |
| Example 5 | 261 |
| Example 6 | 269 |
| Example 7 | 268 |
| Example 8 | 262 |
| Example 9 | 266 |
| Comparative example 1 | 255 |
| Photoresist film material 1 | 142 |
| Photoresist film material 2 | 125 |
| Photoresist film material 3 | 112 |
| $SiO_2$ | 450 |

As shown in Table 4, the dry etching rate in $CHF_3/CF_4$ gas of the anti-reflection films formed from the anti-reflection film materials (Example 1-Example 9) of the present invention were high enough compared with those of the photoresist films, and slow enough compared with the $SiO_2$ film. Therefore, when the processing layer of the substrate is $SiO_2$ film, it has sufficient function as a hard mask in etching of a substrate.

2) Etching Test with $Cl_2/BCl_3$ Gas

A thickness difference before and after etching of the anti-reflection film and p-Si were determined using a dry etching apparatus L-507 D-L manufactured by Nichiden Aneruba Co.,Ltd.

Etching conditions are shown below.

| Chamber pressure | 40.0 Pa |
|---|---|
| RF power | 300 W |
| Gap | 9 mm |
| Gas flow amount of $Cl_2$ | 30 ml/min |
| Gas flow amount of $BCl_3$ | 30 ml/min |
| Gas flow amount of $CHF_3$ | 100 ml/min |
| $O_2$ quantity-of-gas-flow | 2 ml/min |
| Time | 60 sec |

The result was shown in Table 5.

TABLE 5

| Film material etc | $Cl_2/BCl_3$ gas etching rate(nm/min) |
|---|---|
| Example 1 | 115 |
| Example 2 | 118 |
| Example 3 | 111 |
| Example 4 | 122 |
| Example 5 | 114 |
| Example 6 | 122 |
| Example 7 | 125 |
| Example 8 | 129 |
| Example 9 | 126 |
| Comparative example 1 | 120 |
| p-Si | 300 |

As shown in Table 5, the anti-reflection films formed from the anti-reflection film materials (Example 1-Example 9) of the present invention had a dry etching rate in $Cl_2/BCl_3$ gas slow enough as compared with p-Si. Therefore, when the processing layer of the substrate is p-Si, the performance as a hard mask is sufficient.

The present invention is not limited to the above-described embodiment. The above-described embodiment is a mere example, and those having the substantially same structure as that described in the appended claims and providing the similar action and effects are included in the scope of the present invention.

What is claimed is:

1. An anti-reflection film material used in lithography which is an anti-reflection film material used in lithography and contains at least a polymer compound having repeating units for copolymerization represented by the following general formula (1):

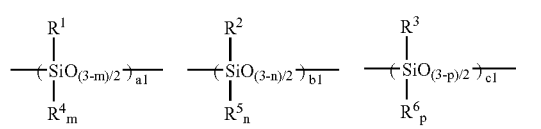

wherein $R^1$ is a monovalent organic group having a crosslink group, $R^2$ is a monovalent organic group having a light-absorption group, and $R^3$ is a monovalent organic group selected from the group consisting of:

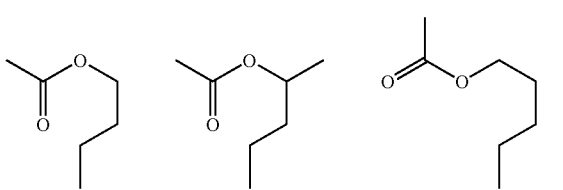

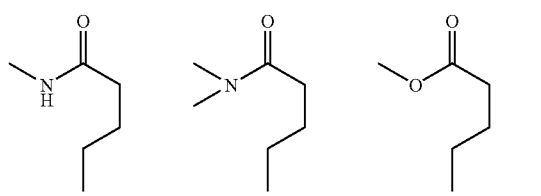

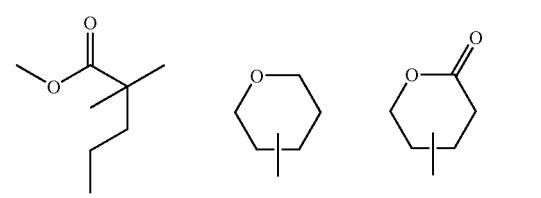

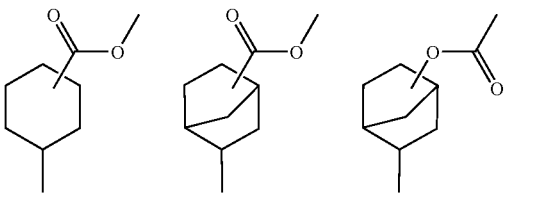

-continued

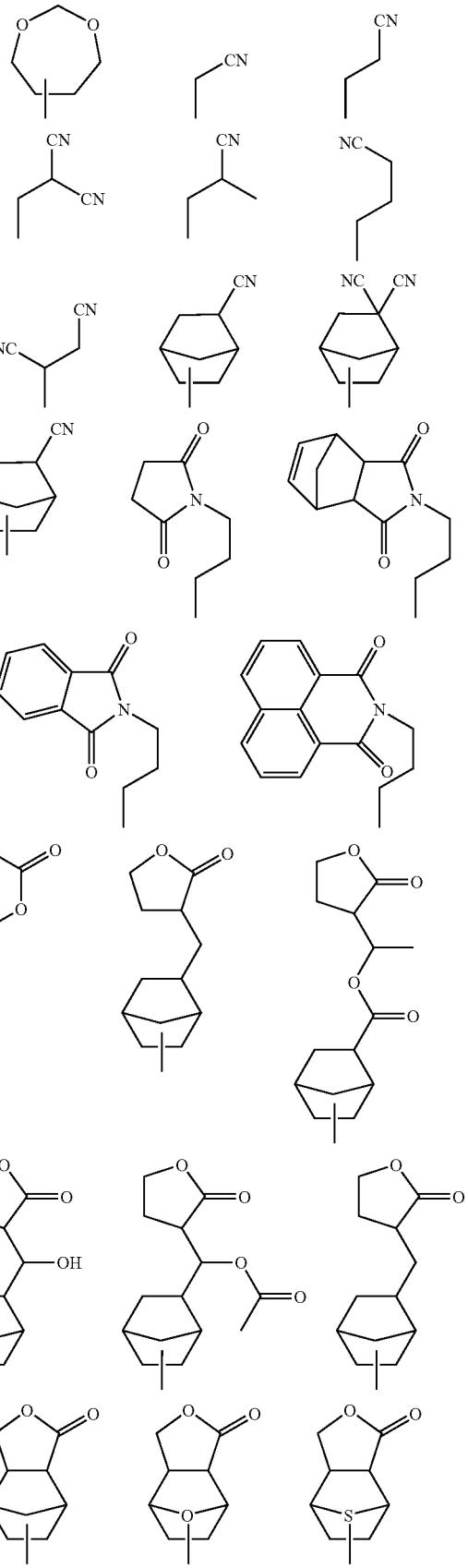

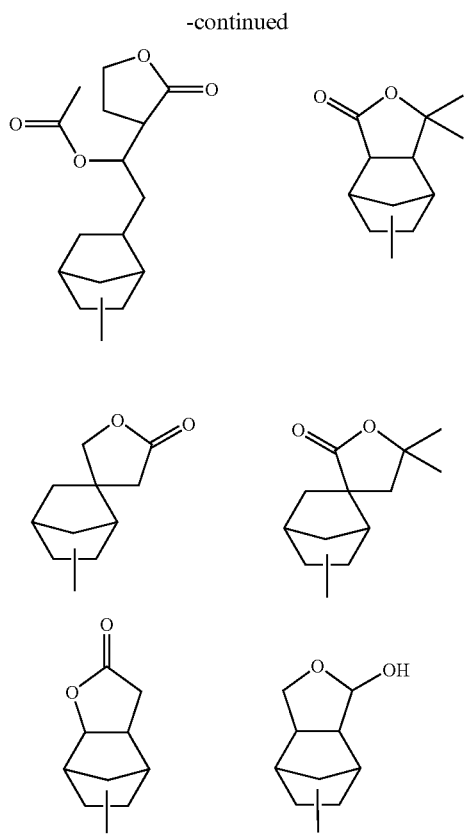

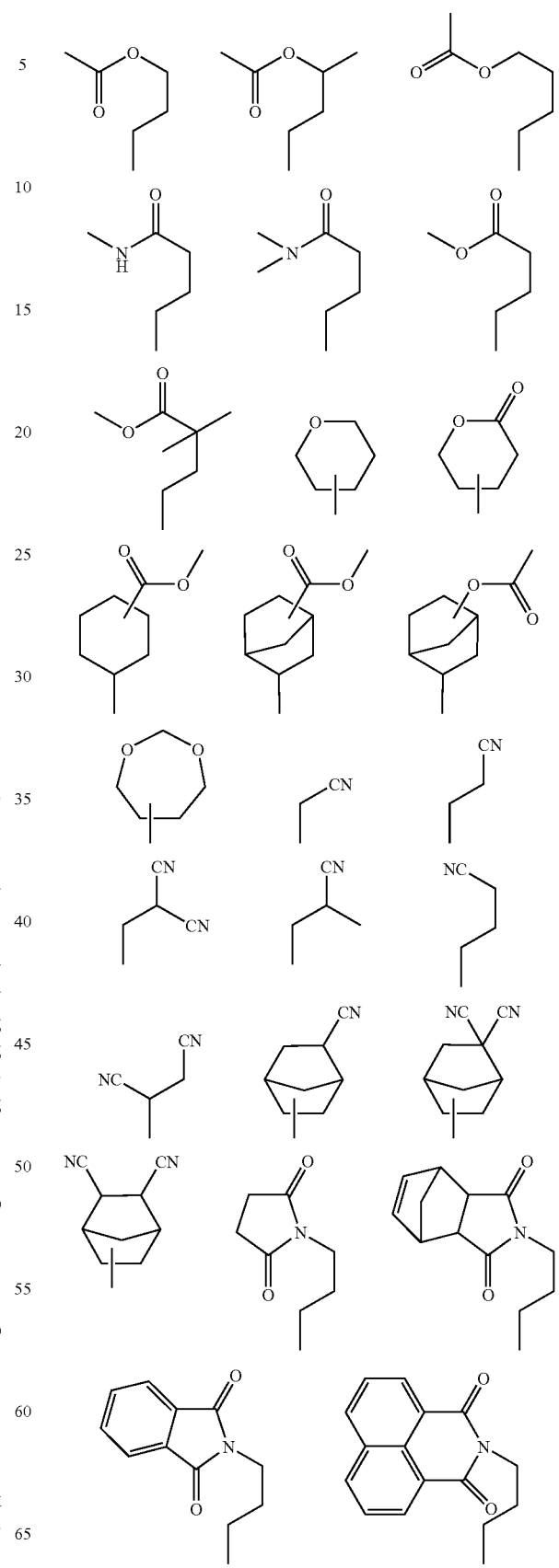

; a1, b1 and c1 are 0<a1<1, 0<b1<1, 0<c1<1, and 0.5≦a1+b1+c1≦1; each of $R^4$, $R^5$ and $R^6$ is a hydrogen atom, a hydroxy group, an alkyl group having 1–6 carbon atoms, an aryl group having 6–10 carbon atoms, or a fluorinated alkyl group having 1–6 carbon atoms; and each of m, n and p is 0 or 1.

2. An anti-reflection film material used in lithography which is an anti-reflection film material used in lithography and contains at least a polymer compound having repeating units for copolymerization represented by the following general formula (2) and a polymer compound having repeating units for copolymerization represented by the following general formula (3):

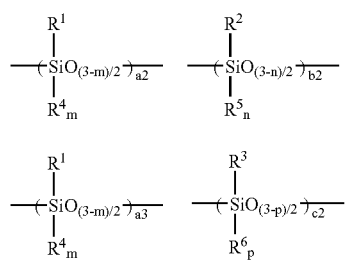

(2)

(3)

wherein $R^1$ is a monovalent organic group having a crosslink group, $R^2$ is a monovalent organic group having a light-absorption group, and $R^3$ is a monovalent organic group selected from the group consisting of:

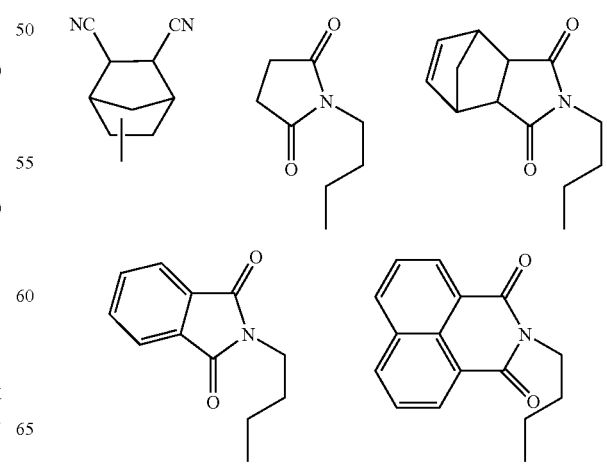

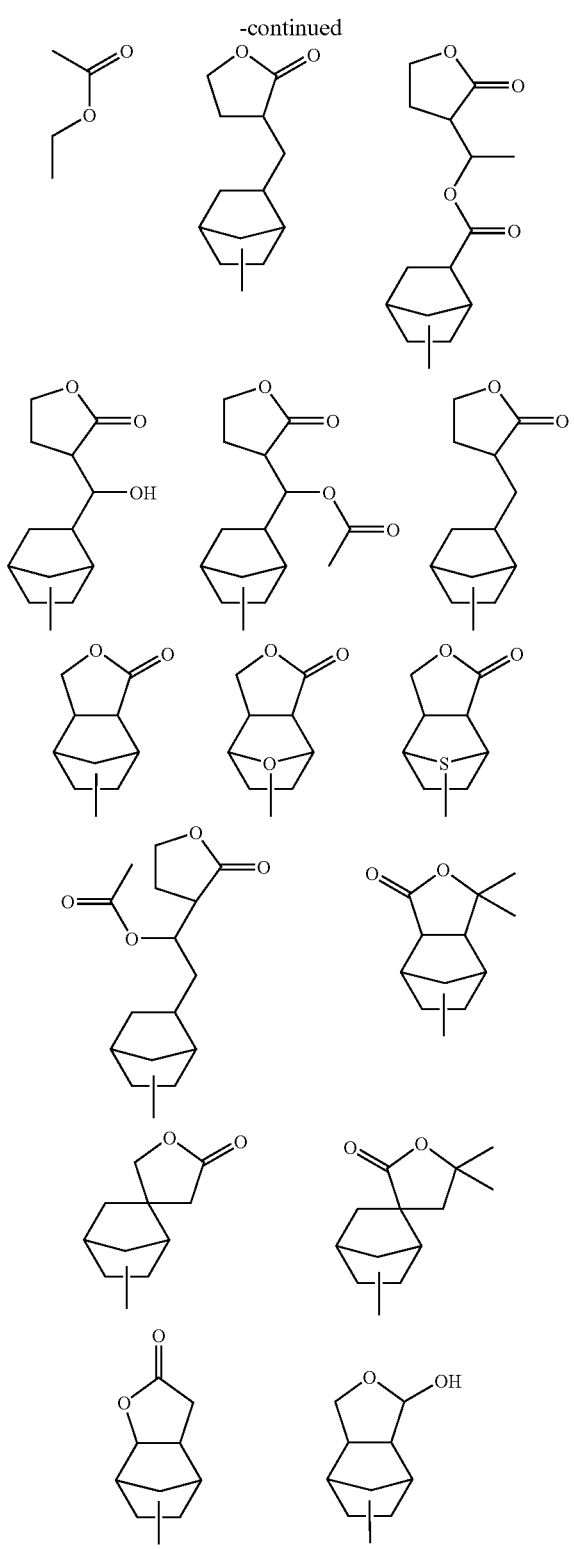

; each of $R^4$, $R^5$, and $R^6$ a hydrogen atom, a hydroxy group, an alkyl group having 1–6 carbon atoms, an aryl group having 6–10 carbon atoms, or a fluorinated alkyl group having 1–6 carbon atoms; each of m, n and p is 0 or 1; a2 and b2 are 0<a2<1, 0<b2<1, and 0.5≦a2+b2≦1; and a3 and c2 are 0<a3<1, 0<c2<1, and 0.5≦a3+c2≦1.

3. The anti-reflection film material according to claim 1 which further contains an organic solvent and/or an acid generating agent.

4. The anti-reflection film material according to claim 2 which further contains an organic solvent and/or an acid generating agent.

5. The anti-reflection film material according to claim 1 which further contains a crosslinking agent.

6. The anti-reflection film material according to claim 2 which further contains a crosslinking agent.

7. The anti-reflection film material according to claim 1 wherein the light-absorption group in the repeating unit of the polymer compound contained in the anti-reflection film material is an aromatic group or a group having a Si—Si bond.

8. The anti-reflection film material according to claim 2 wherein the light-absorption group in the repeating unit of the polymer compound contained in the anti-reflection film material is an aromatic group or a group having a Si—Si bond.

9. A substrate which has at least an anti-reflection film obtained by baking the anti-reflection film material according to claim 1 on the substrate.

10. A substrate which has at least an anti-reflection film obtained by baking the anti-reflection film material according to claim 2 on the substrate.

11. A method for forming a pattern on a substrate by lithography comprising at least applying to the substrate an anti-reflection film material according to claim 1 and baking the anti-reflection film material to form an anti-reflection film, applying to the anti-reflection film a photoresist film material and pre-baking the photoresist film material to form a photoresist film, exposing a pattern circuit range of the photoresist film, developing with a developer to form a resist pattern on the photoresist film, and etching the anti-reflection film and the substrate with using as a mask the photoresist film on which the resist pattern is formed to form a pattern on the substrate.

12. A method for forming a pattern on a substrate by lithography comprising at least applying to the substrate an anti-reflection film material according to claim 2 and baking the anti-reflection film material to form an anti-reflection film, applying to the anti-reflection film a photoresist film material and pre-baking the photoresist film material to form a photoresist film, exposing a pattern circuit range of the photoresist film, developing with a developer to form a resist pattern on the photoresist film, and etching the anti-reflection film and the substrate with using as a mask the photoresist film on which the resist pattern is formed to form a pattern on the substrate.

13. A method for forming a pattern on a substrate by lithography comprising at least applying to the substrate an anti-reflection film material according to claim 1 and baking the anti-reflection film material to form an anti-reflection film, applying to the anti-reflection film a photoresist film material and pre-baking the photoresist film material to form a photoresist film, exposing a pattern circuit range of the photoresist film, developing with a developer to form a resist pattern on the photoresist film, etching the anti-reflection film with using as a mask the photoresist film on which the resist pattern is formed, and etching the substrate with using as a mask the anti-reflection film on which the pattern is formed, to form a pattern on the substrate.

14. A method for forming a pattern on a substrate by lithography comprising at least applying to the substrate an anti-reflection film material according to claim 2 and baking the anti-reflection film material to form an anti-reflection film, applying to the anti-reflection film a photoresist film material and pre-baking the photoresist film material to form a photoresist film, exposing a pattern circuit range of the photoresist film, developing with a developer to form a resist pattern on the photoresist film, etching the anti-reflection film with using as a mask the photoresist film on which the resist pattern is formed, and etching the substrate with using as a mask the anti-reflection film on which the pattern is formed, to form a pattern on the substrate.

16. A method for forming a pattern on a substrate by lithography comprising at least, forming an organic film on the substrate, applying to the organic film the anti-reflection film material of claim 2 and baking the anti-reflection film material to form an anti-reflection film, applying a photoresist film material to the anti-reflection film and pre-baking the photoresist film material to form a photoresist film, exposing a pattern circuit range of the photoresist film, developing with a developer to form a resist pattern on the photoresist film, etching the anti-reflection film using as a mask the photoresist film on which the resist pattern is formed, etching the organic film using as a mask the anti-reflection film on which the pattern is formed, and etching the substrate to form a pattern on the substrate.

15. A method for forming a pattern on a substrate by lithography comprising at least, forming an organic film on the substrate, applying to the organic film the anti-reflection film material of claim 1 and baking the anti-reflection film material to form an anti-reflection film, applying a photoresist film material to the anti-reflection film and pre-baking the photoresist film material to form a photoresist film, exposing a pattern circuit range of the photoresist film, developing with a developer to form a resist pattern on the photoresist film, etching the anti-reflection film using as a mask the photoresist film on which the resist pattern is formed, etching the organic film using as a mask the anti-reflection film on which the pattern is formed, and etching the substrate to form a pattern on the substrate.

* * * * *